(12) United States Patent
Okayama et al.

(10) Patent No.: US 6,742,977 B1
(45) Date of Patent: Jun. 1, 2004

(54) SUBSTRATE PROCESSING DEVICE, SUBSTRATE CONVEYING DEVICE, AND SUBSTRATE PROCESSING METHOD

(75) Inventors: Satohiro Okayama, Tokyo (JP); Motoichi Kanazawa, Tokyo (JP); Takeshige Ishida, Tokyo (JP); Tomohiko Takeda, Tokyo (JP); Yukio Akita, Tokyo (JP); Satoru Ichimura, Tokyo (JP); Kazunori Suzuki, Tokyo (JP); Teruo Yoshino, Tokyo (JP); Tokunobu Akao, Tokyo (JP); Yasunobu Nakayama, Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/503,916

(22) Filed: Feb. 15, 2000

(30) Foreign Application Priority Data

Feb. 15, 1999 (JP) .............................. 11-036447
Feb. 3, 2000 (JP) ........................... 2000-026703

(51) Int. Cl.⁷ .............................................. H01L 21/68
(52) U.S. Cl. ..................... 414/217; 414/935; 414/221; 414/940; 118/719
(58) Field of Search ................. 118/219, 725, 118/729; 414/217, 935, 940, 941, 221

(56) References Cited

U.S. PATENT DOCUMENTS

| | | | | |
|---|---|---|---|---|
| 3,968,885 A | * | 7/1976 | Hassan et al. | 414/591 |
| 5,135,349 A | * | 8/1992 | Lorenz et al. | 414/744.6 |
| 5,439,547 A | * | 8/1995 | Kumagai | 156/345 |
| 5,462,397 A | * | 10/1995 | Iwabuchi | 414/217 |
| 5,512,320 A | * | 4/1996 | Turner et al. | 427/255 |
| 5,697,749 A | * | 12/1997 | Iwabuchi et al. | 414/217 |
| 5,784,799 A | * | 7/1998 | Kato et al. | 34/92 |
| 5,855,681 A | * | 1/1999 | Maydan et al. | 118/719 |
| 5,934,856 A | * | 8/1999 | Asakawa et al. | 414/217 |
| 6,048,154 A | * | 4/2000 | Wytman | 414/217 |
| 6,053,980 A | | 4/2000 | Suda et al. | |
| 6,102,164 A | * | 8/2000 | McClintock et al. | 187/267 |
| 6,176,667 B1 | * | 1/2001 | Fairbairn et al. | 414/217 |

FOREIGN PATENT DOCUMENTS

| | | |
|---|---|---|
| JP | A-05-063223 | 3/1993 |
| JP | A-07-042800 | 2/1995 |
| JP | A-07-086169 | 3/1995 |
| JP | A-07-099167 | 4/1995 |
| JP | A-07-142552 | 6/1995 |
| JP | A-10-107124 | 4/1998 |
| JP | A-11-135600 | 5/1999 |

* cited by examiner

Primary Examiner—Eileen D. Lillis
Assistant Examiner—Charles A. Fox
(74) Attorney, Agent, or Firm—Oliff & Berridge, PLC

(57) ABSTRACT

An unprocessed substrate is conveyed to a film-processing chamber at the same time a processed substrate is conveyed to a substrate preparation chamber, reducing the substrate processing cycle, thereby increasing the yield per unit time. The substrate preparation chamber has a two-tiered structure for receiving processed substrates and unprocessed substrates. A two-tiered transfer robot allows the substrates to be removed or placed into the preparation and process chambers at the same time, thus decreasing the cycle time for processing a substrate.

18 Claims, 23 Drawing Sheets

SUBSTRATE PROCESSING DEVICE, SUBSTRATE CONVEYING DEVICE, AND SUBSTRATE PROCESSING METHOD

BACKGROUND OF THE INVENTION

1. Field of the Invention

The present invention relates to a substrate processing device, a substrate conveying device, and a substrate processing method, and in particular to a CVD device, dry etching device, ashing device, sputtering device, or other dry process device for manufacturing LCDs or semiconductors.

2. Description of the Related Art

FIGS. 27 and 28 depict configurational examples of a conventional single-piece substrate processing device.

FIG. 27 is a diagram illustrating an in-line LCD plasma CVD device. A first conveyance stand Ti is connected to a load-side cassette stand S1, a load-side substrate preparation chamber L1 is connected by means of a gate valve to the first conveyance stand T1, and a first conveyance chamber T2 is connected by means of a gate valve to the load-side substrate preparation chamber L1. A preheating chamber H is connected by means of a gate valve to the first conveyance chamber T2. In addition, a first film-forming chamber R1, a second conveyance chamber T3, a second film-forcing chamber R2, a third conveyance chamber T4, and a third film-forming chamber R3 are sequentially connected by means of gate valves to the first conveyance chamber T2; an unload-side substrate preparation chamber L2 doubling as a substrate-cooling chamber is connected by means of a gate valve to the third conveyance chamber T4; a second conveyance stand T5 is connected by means of a gate valve to the unload-side substrate preparation chamber L2; and an unload-side cassette stand S2 is connected to the second to conveyance stand T5.

The cassette stands S1 and S2 can accept and discharge substrate cassettes that carry substrates and convey each individual substrate to the load-side substrate preparation chamber L1 by operating in tandem with the conveying device of the first conveyance stand T1, whereat the conveying device of the first conveyance chamber T2 conveys the substrates of the load-side substrate preparation chamber L1 to the preheating chamber H, and the substrates of preheating chamber H to the first film-forming chamber R1. The conveying device of the second conveyance chamber T3 conveys substrates from the first film-forming chamber R1 to the second film-forming chamber R2; the conveying device of the third conveyance chamber T4 conveys substrates from the second film-forming chamber R2 to the third film-forming chamber R3 or from the third film-forming chamber R3 to the unload-side substrate preparation chamber L2; and the conveying device of the second conveyance stand T5 conveys substrates from the unload-side substrate preparation chamber L2 to the unload-side cassette stand S2. The conveying devices of the first conveyance stand T1, first conveyance chamber T2, second conveyance chamber T3, third conveyance chamber T4, and second conveyance stand T5 are each capable of conveying substrates independently. Further, the conveyances of the substrate by the conveying devices of the first and second conveyance stands T1 and T5 are carried out in the atmosphere. On the other hand, the conveyances of the substrate by the conveying devices of the first, second and third conveyance chambers T2, T3 and T4 are carried out in a vacuum.

FIG. 28 is a diagram illustrating a cluster-type LCD plasma CVD device. Vacuum chambers are arranged in a circle along the side walls of a vacuum conveyance chamber T2 shaped as a heptagon on the outside. The following devices, listed in the clockwise direction when viewed from the front, are sequentially connected in an airtight manner by means of gate valves: a substrate heating chamber H, a second processing chamber R2 serving as a film-forming chamber, a fourth processing chamber R4, a second substrate preparation chamber L2 provided with a load lock chamber, a first substrate preparation chamber L1, a third processing chamber R3 serving as a film-forming chamber, and a first processing chamber R1.

The vacuum conveyance robot A of the central vacuum conveyance chamber T2 is equipped with a conveyance arm and is capable of conveying substrates to and from any of the aforementioned plurality of chambers H, R1–R4, and L1–L2 in the vacuum. A first cassette stand S1 and second cassette stand S2 for loading or unloading substrate cassettes are disposed opposite the first substrate preparation chamber L1 and second substrate preparation chamber L2, respectively. Atmospheric conveyance robots B1 and B2, each having a set of conveyance arms, are provided to an atmospheric conveyance stand T1 between the first substrate preparation chamber L1 and first cassette stand S1, and the second substrate preparation chamber L2 and second cassette stand S2, respectively. The atmospheric conveyance robots B1 and B2 are designed to convey substrates between the first and second cassette stands S1 and S2, and the first and second substrate preparation chambers L1 and L2 in the atmosphere.

A substrate is transported to the substrate heating chamber H after being received from the first substrate preparation chamber L1 by the conveyance arm of the vacuum conveyance robot A inside the vacuum conveyance chamber T2. The heated substrate is taken out by the vacuum conveyance robot A from the substrate heating chamber H, transported to any of the first to fourth processing chambers R1 to R4, and processed there.

After substrate processing has been completed, the substrate is received by the conveyance arm of the vacuum conveyance robot A and mounted in the second substrate preparation chamber L2. The second substrate preparation chamber L2 stores processed substrates until all the substrates have been processed in the first substrate preparation chamber L1. The substrates are cooled while in storage.

When the processing of all the substrates has been completed, the substrate cassette is taken out by the second atmospheric conveyance robot B2 from the second substrate preparation chamber L2 and is moved to the second cassette stand S2. The substrate cassette loaded with unprocessed substrates and mounted on the first cassette stand S1 is transported by the first atmospheric conveyance robot B1 to the first substrate preparation chamber L1, and the above-described processing is continued.

Although a cluster-type substrate processing device was described above with reference to an LCD plasma CVD device, the same reasoning applies to an LCD dry etching, ashing, or LCD sputtering device. The processing chambers R1 to R4 are used as film-forming, etching, and sputtering chambers, and the substrate heating chamber H may be dispensed with when there is no need for a step in which the substrates are heated prior to film forming or sputtering.

In the conventional in-line-type plasma CVD device shown in FIG. 27, robots used exclusively for loading and unloading are arranged symmetrically about the corresponding processing chambers, reducing the dead time for the reaction chambers R, substrate preparation chambers T, and substrate heating chamber H, and resulting in increased throughput. This system is disadvantageous, however, in that it uses a large number of robots, and is therefore costly and has a larger footprint.

The conventional cluster-type plasma CVD device depicted in FIG. 28 is also effective as a device that requires a plurality of reaction chambers R and delivers high throughput. When, however, an attempt is made to equip a single CVD device with more reaction chambers in order to achieve higher throughput, the following measures must be taken to increase throughput with the same chamber structure: (1) the substrate heating chamber H must be provided with a plurality of charges (slots), (2) a frog-leg, double-hand robot A is needed to reduce the dead time of processing chambers R, (3) high-speed conveyance robots capable of 360° rotation must be devised, and other measures aimed at increasing the processing capacity of common components must be taken.

A resulting drawback is that the vacuum conveyance chamber T2 and substrate heating chamber H become more expensive, and the vacuum chambers increase in size. The technical issues encountered during attempts to achieve such increases in processing capacity by adopting a linear approach are particularly daunting in the case of LCD production lines, for which the increase in substrate dimensions is considerable. Enormous costs are thus involved. Even when the substrate dimensions remain the same as in the past and the number of reaction chambers is limited to one or two in order to provide a device whose throughput remains low but adequate, the drawback is that, in contrast to the case described above, the share of common components increases in terms of cost and footprint, resulting in considerable losses.

The above-described problems are common to dry etching/ashing composite devices and sputtering devices, and semiconductor manufacturing devices are affected in the same manner.

To obtain a device that is flexible enough to be adapted to a variety of desired throughputs, a single device must be composed of added-value film-forming chambers, and a sufficient number of such devices must be provided to achieve the desired throughput. To enhance the overall performance of these devices and to render them more efficient, it is necessary to design a system that is less expensive, is more compact, and can realize a throughput that is as good as or better than the throughput per conventional cluster-type film-forming chamber.

It is also necessary to minimize the size and number of the device chambers and to arrange the chambers in a square configuration in order to overcome another drawback of prior art; namely, to eliminate unneeded footprint and to provide an efficient device. Yet another requirement is that in order to trim costs and to provide an efficient device, it is necessary to take the same measures as those described above: that is, to reduce the number of chambers constituting the device and to minimize the size of these chambers. It is also necessary to simplify the conveyance system (to reduce the number of drive shafts) and to simplify the interior structure of the chambers.

In view of this, a CVD device having a uniaxial (in-line) configuration such as that shown in FIG. 29 has been proposed. First, some of the conventional vacuum chambers (a total of two to three chambers, of which one is a substrate heating chamber, and the rest are substrate preparation chambers) are integrated into a single chamber by combining the functions of the substrate preparation chambers and substrate heating chambers (functions that have been performed by separate chambers in the past) in order to reduce the number of chambers, and providing a new substrate preparation chamber L/H equipped with a substrate heating mechanism. The vacuum chambers can thus be composed of three chambersi a substrate preparation chamber L/H, a vacuum conveyance chamber T2, and a first film-forming chamber R; and the CVD device can be arranged in a square configuration, and the unneeded footprint eliminated, by adopting an axial chamber arrangement, with the vacuum conveyance chamber T2 disposed in the middle. Here, T1 denotes an atmospheric conveyance chamber T1.

It is impossible, however, for the device depicted in FIG. 29 to operate such that substrates are sequentially conveyed in the manner provided by a conventional cluster system or that parallel processing is performed by continuously starting sequential processing routines. Each of the processing cycles (including the conveying time) is therefore added in series to the intervals between the processing cycles of the device. Assuming, for example, that the device has a substrate preparation chamber for single-piece processing and a single-hand substrate conveyance mechanism, the interval between the processing cycles (substrate discharge interval) of the device will be as follows.

Substrate loading time+Preparation chamber evacuation and heating time+Conveyance time (from substrate preparation chamber to film-forming chamber)+Reaction chamber processing time+Conveyance time (from film-forming chamber to substrate preparation chamber)+Preparation chamber atmospheric venting time+Substrate unloading time It is thus impossible for this system to achieve the same throughput per film-forming chamber as that of a conventional cluster system.

An object of the present invention is to overcome the above-described drawbacks of prior art and to provide a substrate processing device, substrate conveying device, and substrate processing method in which the substrate processing device has a uniaxial configuration, the substrate conveyance time can be reduced to produce a shorter substrate processing cycle, and the number of substrates processed per unit of time can be increased.

SUMMARY OF THE INVENTION

The substrate processing device of claim 1 is a substrate processing device comprising a substrate processing chamber for subjecting substrates to prescribed processing; a substrate mounting unit for mounting substrates in the substrate processing chamber; a substrate storage unit for storing unprocessed substrates scheduled to undergo prescribed processing in the substrate processing chamber, or processed substrates that have undergone the prescribed processing therein; and a substrate conveying device for conveying the unprocessed substrates from the substrate storage unit to the substrate mounting unit inside the substrate processing chamber, and conveying the processed substrates from the substrate mounting unit inside the substrate processing chamber to the substrate storage unit; this substrate conveying device being provided with two simultaneously operating substrate conveying units such that one of these substrate conveying units is used to convey the unprocessed substrates from the substrate storage unit to the substrate mounting unit inside the substrate processing chamber; and the other substrate conveying unit is used to convey the processed substrates from the substrate mounting unit inside the substrate processing chamber to the substrate storage unit. The substrate processing chamber, substrate storage unit, and substrate conveying device are disposed along a single axis.

In the substrate processing device of claim 1, the substrate conveyance time can be reduced by about half by providing the substrate conveying device with two substrate conveying units and simultaneously performing an operation in which substrates are conveyed from the substrate storage unit to the substrate mounting unit in the substrate processing chamber, and an operation in which the substrates are conveyed from the substrate mounting unit in the substrate processing chamber to the substrate storage unit. The substrate processing cycle in the substrate processing device can thereby be reduced, and the number of substrates processed per unit of time increased. The present invention allows any arrangement to be used for lining up the two substrate conveying units. The two units can be arranged side by side when device bulkiness is not a concern, or a more compact device can be devised by stacking the devices in a two-tier arrangement so that they substantially overlap when viewed from above. In comparison with the arrangement in which the two substrate conveying units are placed side by side, the two-tier arrangement requires a smaller substrate conveying chamber for accommodating the substrate conveying units, reduces the size of the entire device, and renders the device less expensive. In addition, the substrate conveying chamber can be evacuated faster, and a higher throughput can be obtained. It is also possible to conduct a rigid operation in which one of the two substrate conveying units is used exclusively for unprocessed substrates, and the other for processed substrates, although it is more preferable to abandon this rigid approach and to use the units interchangeably for alternately handling unprocessed substrates and processed, substrates.

The substrate processing device of claim 2 is obtained by modifying the substrate processing device set forth claim 1 such that at least two substrate storage units are provided, one of these substrate storage units is used to store unprocessed substrates, and the other substrate storage unit is used to store processed substrates. In the substrate processing device of claim 2, redundant operation of the substrate conveying device can be eliminated and the substrate conveyance time can be further reduced by bringing at least two substrate storage units in correspondence with two substrate conveying units.

The substrate processing device of claim 3 is obtained by modifying the substrate processing device set forth claim 2 such that a difference in height is established between the substrate mounting surface of the substrate mounting unit and the substrate mounting surface of the substrate storage unit for storing unprocessed substrates; and this difference in height is made substantially the same as the difference in height between the substrate mounting surface of the substrate conveying unit for conveying unprocessed substrates, and the substrate mounting surface of the substrate conveying unit for conveying processed substrates. Preferably, the substrate conveying device may be provided with a single lifting mechanism for simultaneously lowering or raising the substrate conveying unit for conveying unprocessed substrates, and the substrate conveying unit for conveying processed substrates, making it possible to receive the unprocessed substrates from the substrate mounting unit of the substrate processing chamber at the same time as the unprocessed substrates are received from the substrate storage unit for storing the unprocessed substrates of the substrate storage unit. When processed substrates are received in the substrate processing device of claim 3 from the substrate mounting unit of the substrate processing chamber at the same time as unprocessed substrates are received from the substrate storage unit for storing unprocessed substrates, providing the substrate conveying device with a single lifting mechanism allows the vertical operation thereof to be minimized, and the substrate conveyance time to be further reduced.

The substrate processing device of claim 4 is obtained by modifying the substrate processing device set forth in claim 2 or 3 such that the substrate storage unit for storing processed substrates and the substrate mounting unit are disposed so that a difference in height between the substrate mounting surface of the substrate mounting unit and the substrate mounting surface of the substrate storage unit produces; and this difference in height is made substantially the same as the difference in height between the substrate mounting surface of the substrate conveying unit for conveying unprocessed substrates and the substrate mounting surface of the substrate conveying unit for conveying processed substrates. Preferably, the substrate conveying device may be provided with a single lifting mechanism for simultaneously lowering or raising the substrate conveying unit for conveying unprocessed substrates, and the conveying unit for conveying processed substrates, making it possible to deliver unprocessed substrates to the substrate storage unit for storing the unprocessed substrates of the substrate storage unit at the same time as processed substrates are delivered to the substrate mounting unit of the substrate processing chamber. When processed substrates are delivered in the substrate processing device of claim 4 to the substrate storage unit for storing processed substrates at the same time as unprocessed substrates are delivered to the substrate mounting unit of the substrate processing chamber, providing the substrate conveying device with a single lifting mechanism allows the vertical operation thereof to be minimized, and the substrate conveyance time to be further reduced.

The substrate processing device of claim 5 is obtained by modifying the substrate processing device set forth in claim 1 such that a lifting mechanism is provided for raising and lowering the substrate storage units; the substrate storage units raised and lowered by the lifting mechanism are arranged in three or more tiers; the three or more substrate storage units operate during the raising or lowering of the substrate storage units by the lifting mechanism in such a way that one of these substrate storage units is brought to a height corresponding to the position occupied by the unprocessed substrate conveying unit of the substrate conveying device, establishing access from the unprocessed substrate conveying unit; and another substrate storage unit is brought to a height corresponding to the position occupied by the processed substrate conveying unit of the substrate conveying device, establishing access from the processed substrate conveying unit. The substrate processing device of claim 5 requires a shorter processing time interval because three or more tiers of substrate storage units are provided to perform parallel processing with the aid of these substrate storage units, and the three or more tiers of substrate storage units are raised or lowered by a lifting mechanism to establish access to any of these substrate storage units, and because the routine performed using these substrate storage units and considered to be the factor that determines the processing time interval of a device can be reduced if the time needed to process a substrate is shorter than the standard time needed to process a substrate.

The substrate processing device of claim 6 is obtained by modifying the substrate processing device set forth in claim 1,2,3 or 5 such that the substrate conveying units in the substrate conveying device are rectilinearly actuated, and the substrate conveying unit for conveying unprocessed substrates and the substrate conveying unit for conveying processed substrates are expanded or contracted in the opposite directions from each other. The two substrate conveying units provided to the substrate conveying device should preferably be allowed to expand and contract when rectilinearly actuated, and both the substrate conveying unit for conveying unprocessed substrates and the substrate conveying unit for conveying processed substrates should preferably be retracted into the substrate conveying device when in standby mode During substrate conveyance, one of the substrate conveying units (the one designed to convey conveying unprocessed substrates) extends from the substrate conveying device toward the substrate storage unit for storing unprocessed substrates to receive an unprocessed substrate, contracts temporarily, and extends through the substrate conveying device toward the substrate processing chamber to deliver the unprocessed substrate. The device should be configured such that the other substrate conveying unit (the one designed to convey processed substrates) extends from the substrate conveying device toward the substrate processing chamber to receive a processed substrate, contracts temporarily, and extends through the substrate conveying device toward the substrate storage unit for storing processed substrates to deliver the processed substrate. The substrate processing device of claim 6 makes it possible to reduce the area occupied by the substrate conveying device in proportion to the amount previously set aside for substrate rotation, and to efficiently use clean rooms containing such substrate processing devices.

The substrate processing device of claim 7 is obtained by modifying the substrate processing device set forth in claim 1 or 2 such that the substrate storage units are provided with a heater for heating unprocessed substrates, and a heating gas is heated by the heater and fed in a shower. According to the substrate processing device of claim 7, the substrate storage units are provided with a heater, and the substrates are preheated in the substrate storage units, making it possible to reduce the time needed to convey and process the substrates in the substrate processing device. The cost of equipment and the area (footprint) occupied by the equipment can also be reduced. In addition, the substrates can be uniformly heated because the heating gas heated by the heater is fed in a shower. In particular, using a resistance heater makes it possible to heat the substrates rapidly and accurately at low temperatures (200 to 300° C.).

The substrate processing device of claim 8 comprises a single airtightly configured substrate processing chamber for processing substrates, a single substrate conveying chamber, and a single preparation chamber, provided in a sequential manner; a first valve that is provided between the substrate processing chamber and the substrate conveying chamber and that is designed to maintain an airtight condition between the substrate processing chamber and the substrate conveying chamber when closed and to allow the substrates to pass therethrough when open; a second valve that is provided between the substrate conveying chamber and the preparation chamber and that is designed to maintain an airtight condition between the substrate conveying chamber and the preparation chamber when closed and to allow the substrates to pass therethrough when open; a third valve that is provided between the preparation chamber and the atmosphere and that is designed to keep the preparation chamber airtight when closed and to allow the substrates to pass therethrough when open; and a cassette that is disposed at atmospheric pressure outside the preparation chamber and can stack plural substrates at substantially the same height as the preparation chamber and hold them; wherein the substrate conveying chamber is provided with a first substrate conveying device for allowing substrates to be delivered between the single preparation chamber and the single substrate processing chamber; and a second substrate conveying device for allowing substrates to be delivered is provided between the cassette and the preparation chamber.

There are known substrate processing devices in which a plurality of modules, each comprising a substrate processing chamber, a substrate conveying chamber, a preparation chamber, and one to three valves, are stacked up in the vertical direction with respect to a cassette loading chamber, and a substrate conveying device is provided to allow substrates to be conveyed to the preparation chamber of each of the linked modules as well as to a cassette whose position differs from the height of these preparation chambers. By contrast, the invention of claim 8 entails providing a single linked module comprising a substrate processing chamber, a substrate conveying chamber, a preparation chamber, and one to three valves, and disposing the cassette at substantially the same height as the preparation chamber. Consequently, the lifting mechanism for the second substrate conveying device kept at atmospheric pressure can be made lover than the mechanism of a conventional substrate processing device such as that described above, making it possible to reduce the costs incurred in manufacturing the device and to shorten the time needed to convey the substrates.

The substrate processing device of claim 9 is the substrate processing device, as defined in claim 8, wherein the substrate storage unit of the substrate preparation chamber is arranged within a range of the height of the mounting position of the plural substrates stacked in the cassette. Thereby the mechanism of the substrate conveying device is simplified more effectively, so that it is possible to reduce more the cost for manufacturing the device and to shorten more the time needed to convey the substrates.

The substrate processing device of claim 10 is the substrate processing device, as defined in claim 9, wherein the second substrate conveying device has a lifting mechanism, which raises and lowers within a range of allowing the substrate to be introduced and/or carried out, within the range of height of the mounting position of the plural substrates stacked in the cassette. Thus when the lifting mechanism is used as the mechanism provided in the second substrate conveying device, the lifting mechanism can be made lower more effectively, so that it is possible to reduce more the cost incurred in manufacturing the device and to shorten more the time needed to convey the substrates.

The substrate conveying device of claim 11 is a substrate conveying device for conveying unprocessed substrates from a substrate storage unit to a substrate mounting unit inside a substrate processing chamber, and conveying processed substrates from the substrate mounting unit inside the substrate processing chamber to a substrate storage unit, wherein this substrate conveying device is provided with two simultaneously operating substrate conveying units; one of these substrate conveying units is used to convey the unprocessed substrates from the substrate storage unit to the substrate mounting unit inside the substrate processing chamber; and the other substrate conveying unit is used to convey the processed substrates from the substrate mounting unit inside the substrate processing chamber to the substrate storage unit. In the substrate processing device of claim 11, the substrate conveyance time can be reduced by about half by providing the substrate conveying device with two substrate conveying units and simultaneously performing an operation in which substrates are conveyed from the substrate storage unit to the substrate mounting unit in the substrate processing chamber, and an operation in which the substrates are conveyed from the substrate mounting unit in the substrate processing chamber to the substrate storage unit. In particular, the two substrate conveying units should preferably have a two-tier configuration in which the units overlap when viewed from above. Using a two-tier configuration reduces the number of substrate conveying chambers needed to accommodate substrate conveying units, and allows the cost of the device to be reduced. In addition, the substrate conveying chambers can be evacuated faster, and a higher throughput can be obtained.

The substrate processing method of the claim 12 is a substrate processing method for performing an operation in which an unprocessed substrate is received by a second substrate support unit while performing an operation in which a processed substrate is received in a substrate processing chamber by a first substrate support unit; performing an operation in which the unprocessed substrate is introduced into the processing chamber by the second substrate support unit and the unprocessed substrate is subjected to prescribed processing in the substrate processing chamber after the processed substrate is received by the first substrate support unit and the unprocessed substrate is received by the second substrate support unit. The unprocessed substrate thus received is conveyed to a preparation chamber, but the processed substrate thus received may also be conveyed to a substrate storage unit or sent to the processing chamber of the next processing step. Consequently, the time needed to convey substrates can be reduced, the substrate processing cycle in the substrate processing device shortened, and the number of substrates processed per unit of time increased.

The substrate processing method of claim 13 is a substrate processing method, as defined in claim 12, for storing the processed substrate received by the first substrate unit while introducing the unprocessed substrate into the substrate processing chamber by the second substrate support unit. The time needed to convey the substrate can be further reduced by introducing the above-described received unprocessed substrate into the processing chamber while the operation to store the received processed substrate is being performed.

The substrate processing method of claim 14 is a substrate processing method, as defined in claim 12, for starting the operation for receiving the processed substrate and the operation for receiving the unprocessed substrate substantially concurrently. The substrate conveyance time can be minimized, the substrate processing cycle in the substrate processing device can be further reduced, and the number of substrates processed per unit of time can be further increased by starting the operation for receiving the unprocessed substrate substantially concurrently with the operation for receiving the processed substrate.

DESCRIPTION OF THE PREFERRED EMBODIMENTS

An embodiment of the substrate processing device of the present invention will now be described with reference, to a single-piece plasma CVD device for processing LCD substrates.

Figure 1:
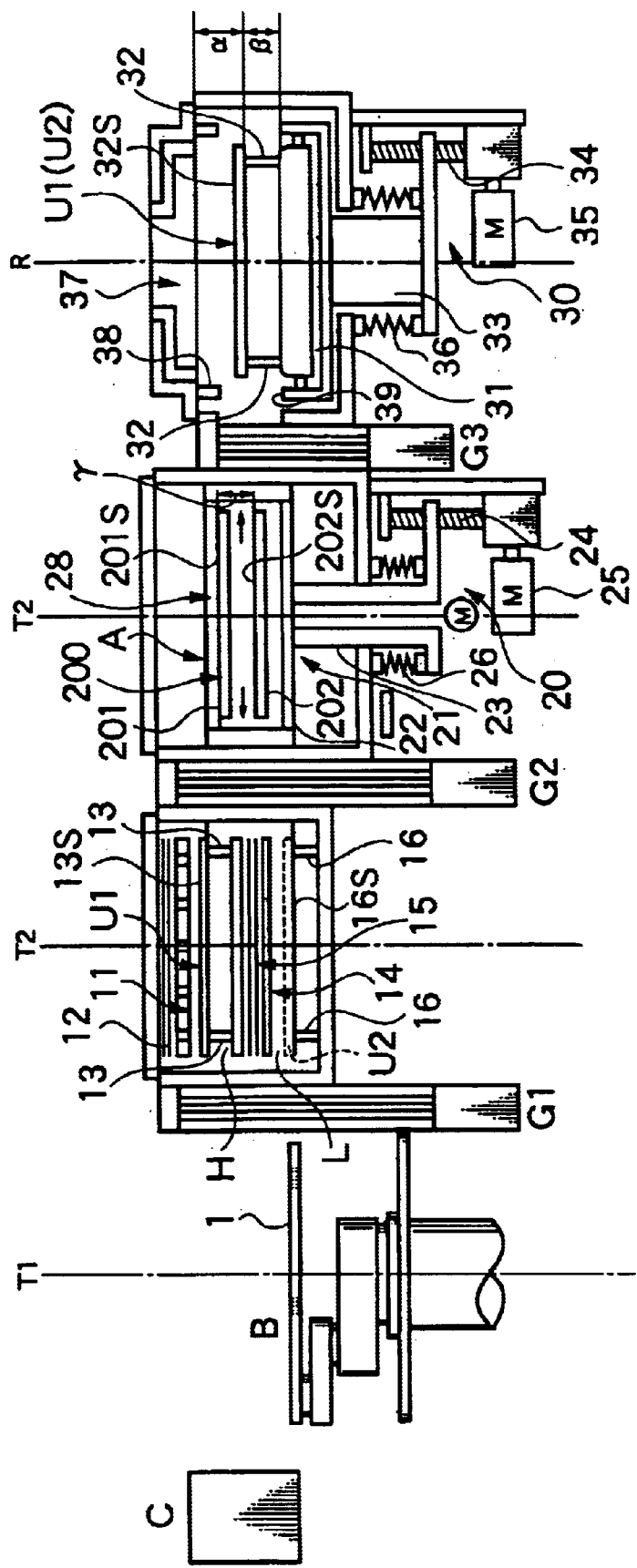
FIG. 1 is a schematic cross section of a CVD device according to an embodiment.
Figure 29:
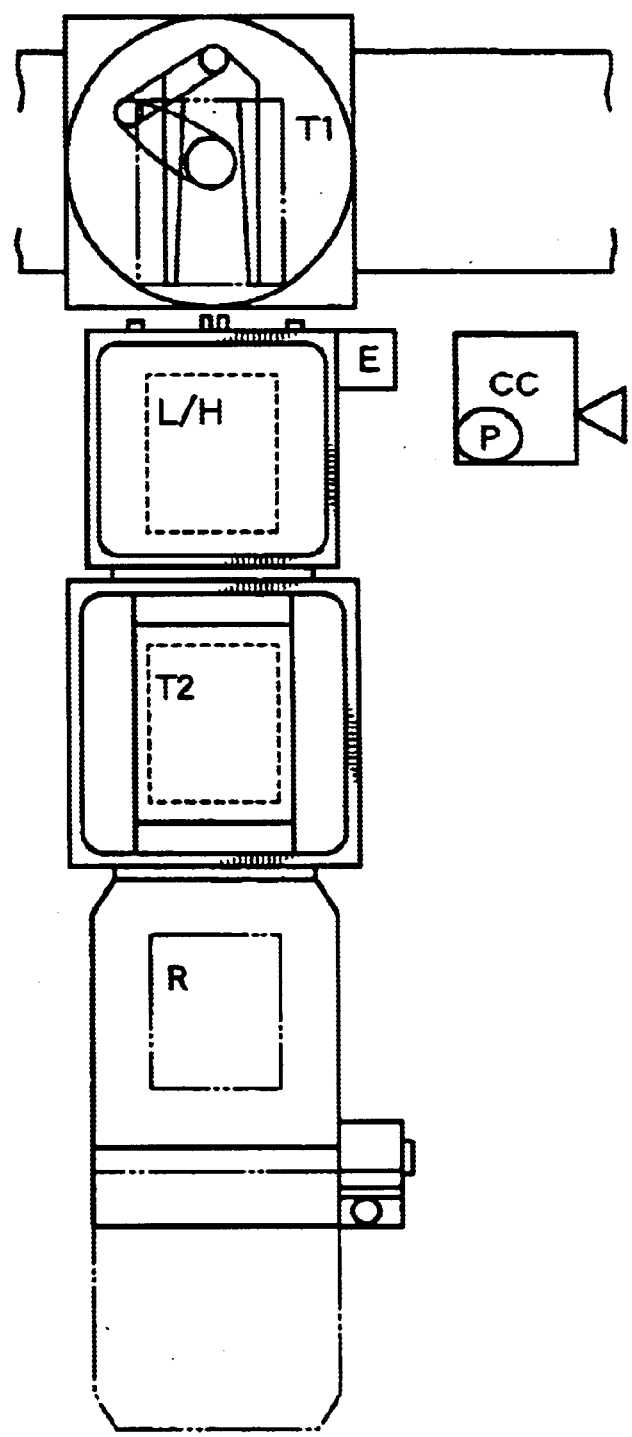
FIG. 29 is a basic structural diagram of a uniaxially configured CVD device common to both the prior art and the embodiment.

The LCD CVD device has the same basic structure as the uniaxially configured CVD device depicted in FIG. 29. Specifically, the device comprises a plurality of vacuum chambers and an atmospheric conveyance chamber T1 provided with an atmospheric conveyance robot B. The plurality of vacuum chambers consist of the following three chambers: a substrate preparation chamber L/H that combines the functions of a substrate heating chamber with those of a preparation chamber (load lock chamber) in a single substrate storage unit, a vacuum conveyance chamber T2 that functions as a substrate conveying chamber equipped with a vacuum conveyance robot, and a film-forming chamber R that functions as a substrate processing chamber for forming and processing films. The three vacuum chambers are disposed along an axis on both sides of the vacuum conveyance chamber T2, and the substrate processing device has a square, rather than round, configuration, making it possible to eliminate unneeded footprint. In addition, the vacuum chambers (a total of two to three chambers, of which one is a substrate heating chamber, and the rest are substrate preparation chambers) are integrated into a single chamber by combining the substrate heating chamber and preparation chamber (heretofore used in an arrangement in which processing was performed using separate chambers) into a single substrate preparation chamber L/H. The floor area occupied by the device can thus be reduced by combining the vacuum chamber into a uniaxial arrangement, A detailed description will now be given with reference to FIG. 1. FIG. 1 is a longitudinal section obtained by cutting the above-described LCD CVD device in the axial direction. A substrate cassette C for storing substrates is disposed on the side where atmospheric pressure is maintained. Adjacent to the substrate cassette C is an atmospheric conveyance chamber T1, which is provided with an atmospheric conveyance robot B as a second substrate conveying device for conveying the substrates inside the substrate cassette C. A substrate preparation chamber L/H is provided adjacent to the atmospheric conveyance chamber T1 by means of an interposed a gate valve G1. The substrate cassette C has substantially the same height as the substrate preparation chamber L/H. A vacuum conveyance chamber T2, which is provided with a vacuum conveyance robot A as a first substrate conveying device, is connected to the substrate preparation chamber L/H by means of a gate valve G2. A film-forming chamber R is connected by means of a gate valve G3 to the vacuum conveyance chamber T2.

The atmospheric conveyance robot B of the atmospheric conveyance chamber T1 has a arm 1. The tip of the arm 1 conveys substrates by performing positive direction rectilinear motion as a result of such uniaxial actuation, changing its direction arbitrarily as a result of such gyration, and performing rectilinear motion again. The substrates are conveyed by being delivered between the substrate cassette C and the substrate preparation chamber L/H. Specifically, processed substrates U2 are loaded to the substrate cassette C and unprocessed substrates U1 are unloaded from the substrate cassette C on one side, and unprocessed substrates U1 are loaded to the substrate preparation chamber L/H and processed substrates U2 are unloaded from the substrate preparation chamber L/H on the other side.

The substrate preparation chamber L/H stores unprocessed substrates U1 to be processed in a prescribed manner in the film-forming chamber R, or processed substrates U2 already processed in a prescribed manner (the unprocessed substrates U1 and/or processed substrates U2 will be referred to merely as "substrates U"). The substrate storage unit in the substrate preparation chamber L/H has a two-tier configuration such that the side corresponding to the upper arm 201 of the substrate conveying unit 28 of the vacuum conveyance robot A is designated as an unprocessed substrate receiving slot H (H-chamber), and the side corresponding to the lower arm 202 of the substrate conveying unit 28 is designated as a processed substrate receiving slot L (L-chamber). Thereby, even if heating of the unprocessed substrates U1 and cooling of the processed substrates U2 are necessary, these can be coped with severally. As a result, it is possible to reduce the processing time. Moreover, the side corresponding to the upper arm 201 of the substrate conveying unit 28 of the vacuum conveyance robot A can be designated as an unprocessed substrate slot L, and the aide corresponding to the lower arm 202 of the substrate conveying unit 28 is designated as a processed substrate receiving slot H.

The upper unprocessed substrate receiving slot H is provided with a panel heater 11 and a reflecting plate 12, and each unprocessed substrate U1 is preheated while horizontally supported by a plurality of support pins 13. The lower unprocessed substrate receiving slot L is provided with a cooling plate 14 and a reflecting plate 15, and each unprocessed substrate U2 is cooled while horizontally supported by a plurality of support pins 16. The surfaces in contact with the tops of the plurality of support pins 13 and 16 are designated as substrate mounting surfaces 13S and 16S, respectively.

The vacuum conveyance chamber T2 is equipped with a vacuum conveyance robot A as a substrate conveying device capable of delivering substrates U. The substrate conveyance robot A comprises a substrate conveying unit 28 for conveying substrates, and a conveyance mechanism unit 21 as a drive transmission system for actuating the substrate conveying unit 28. The substrate conveying unit 28 comprises a substrate support unit (end effector) for supporting the substrates U, and a conveyance arm 200 for moving the substrate support unit.

The conveyance arm 200 of the vacuum conveyance robot A has a two-tier configuration in which one tier is an upper arm 201 for conveying each unprocessed substrate U1 from the substrate preparation chamber L/H to a substrate mounting platform 31, which functions as an anode in the film-forming chamber R. The other tier is a lower arm 202 for conveying each processed substrate U2 from the substrate mounting platform 31 in the film-forming chamber R to the substrate preparation chamber L/H. The lower arm is operated simultaneously with the upper arm 201.

A difference $\alpha$ in height exists between the substrate mounting surface 13S of the unprocessed substrate receiving slot H and the substrate mounting surface 32S of the substrate support pins 32 in the film-forming chamber R. This difference $\alpha$ in height is substantially the some as the difference $\gamma$ in height between the substrate mounting surface 201S of the upper arm 201 for conveying unprocessed substrates U1, and the substrate mounting surface 202S of the lower arm 202 for conveying processed substrates U1. The purposes is to eliminate unneeded vertical operation of the vacuum conveyance robot A.

A difference $\beta$ in height exists between the substrate mounting surface 16S of the processed substrate receiving slot L and the substrate mounting surface 32S of the substrate support pins 32. This difference $\beta$ in height is substantially the same as the difference $\gamma$ in height between the substrate mounting surface 201S of the upper arm 201 for conveying unprocessed substrates U2, and the substrate mounting surface 202S of the lower arm 202 for conveying processed substrates U2. The purpose is to eliminate unneeded vertical operation of the vacuum conveyance robot A.

The upper and lower arms 201 and 202 of the vacuum conveyance robot A move in a straight line, and these upper arm 201 and lower arm 202 expand and contract in mutually opposite directions. The upper arm 201 proceeds to receive an unprocessed substrate U1 as the lower arm 202 moves toward the film-forming chamber R to receive a processed substrate U2, and the unprocessed substrate U1 thus received is transported to the film-forming chamber R as the processed substrate U2 thus received is being loaded into the substrate preparation chamber L/H. In the process, the operation in which the lower arm 202 moves to receive the processed substrate U2 commences substantially simultaneously with the operation in which the upper arm 201 moves to receive the unprocessed substrate U1.

The conveyance platform 22 for mounting the vacuum conveyance robot A in the vacuum conveyance chamber T2 is linked to a lifting shaft 23 extended inward through the bottom of the vacuum conveyance chamber T2 along the Z-axis to allow the platform to be raised and lowered. Its lifting mechanism 20 is actuated by the lifting shaft 23, which is moved vertically by means of a threaded engagement with a ball screw 24. The ball screw 24 is rotated by a motor 25. The lifting shaft 23 is enveloped by a bellows 26 to ensure airtightness during the axial movement of the lifting shaft 23.

The film-forming chamber R has a plurality of substrate support pins 32, which are provided as substrate mounting units to a substrate mounting platform 31 in the center of the chamber. Substrates U are supported on the substrate support pins 32. The substrate mounting surface 32S is the surface in contact with the tops of the plurality of substrate support pins 32. The substrate mounting platform 31 is linked to a lifting shaft 33 extended inward through the bottom of the film-forming chamber R along the Z-axis to allow the platform to be raised and lowered. Its lifting mechanism 30 is actuated by the lifting shaft 33, which is moved vertically by means of a threaded engagement with a ball screw 34. The ball screw 34 is rotated by a motor 35. The lifting shaft 33 is enveloped by a bellows 36 to ensure airtightness during the axial movement of the lifting shaft 33.

The film-forming chamber R has a two-cell structure. When the substrate mounting platform 31 is lifted, an inner cell is formed by the contact between an inner-call upper half 38 extending toward into the ceiling 37 (which serves as the cathode of the film-forming chamber R), and an inner-cell lower half 39 extending toward the substrate mounting platform 31. The support pins 32 enter the substrate mounting platform 31, allowing the substrate to be transferred from the support pins 32 to the substrate mounting platform 31. Downward movement of the substrate mounting platform 31 opens the inner cell and disengages the support pins 32 from the substrate mounting platform 31, allowing the substrates to be mounted on the support pins 32.

Figure 2:
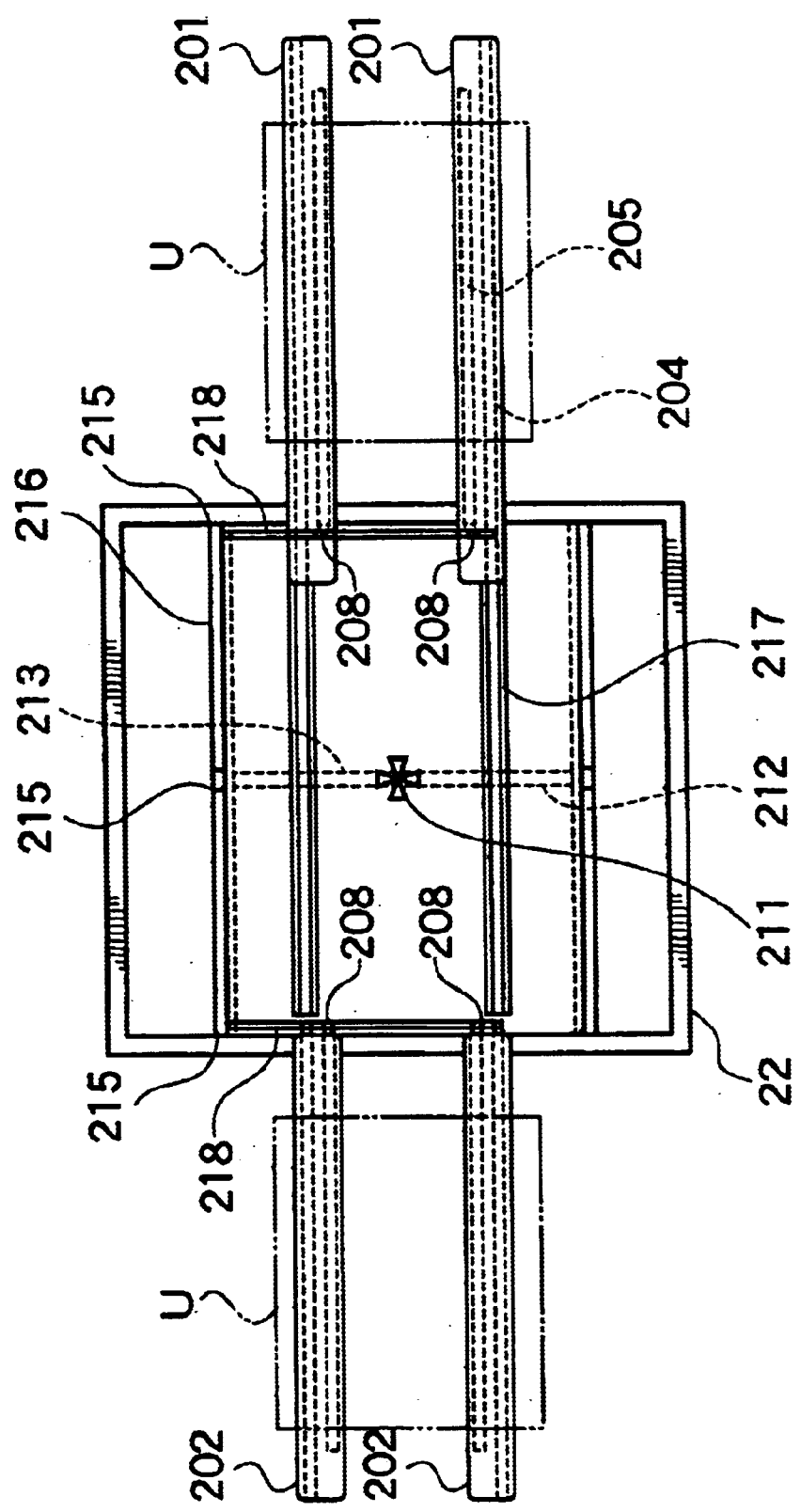
FIG. 2 is plan view depicting a conceptual diagram of a substrate conveyance mechanism according to an embodiment.
Figure 3:
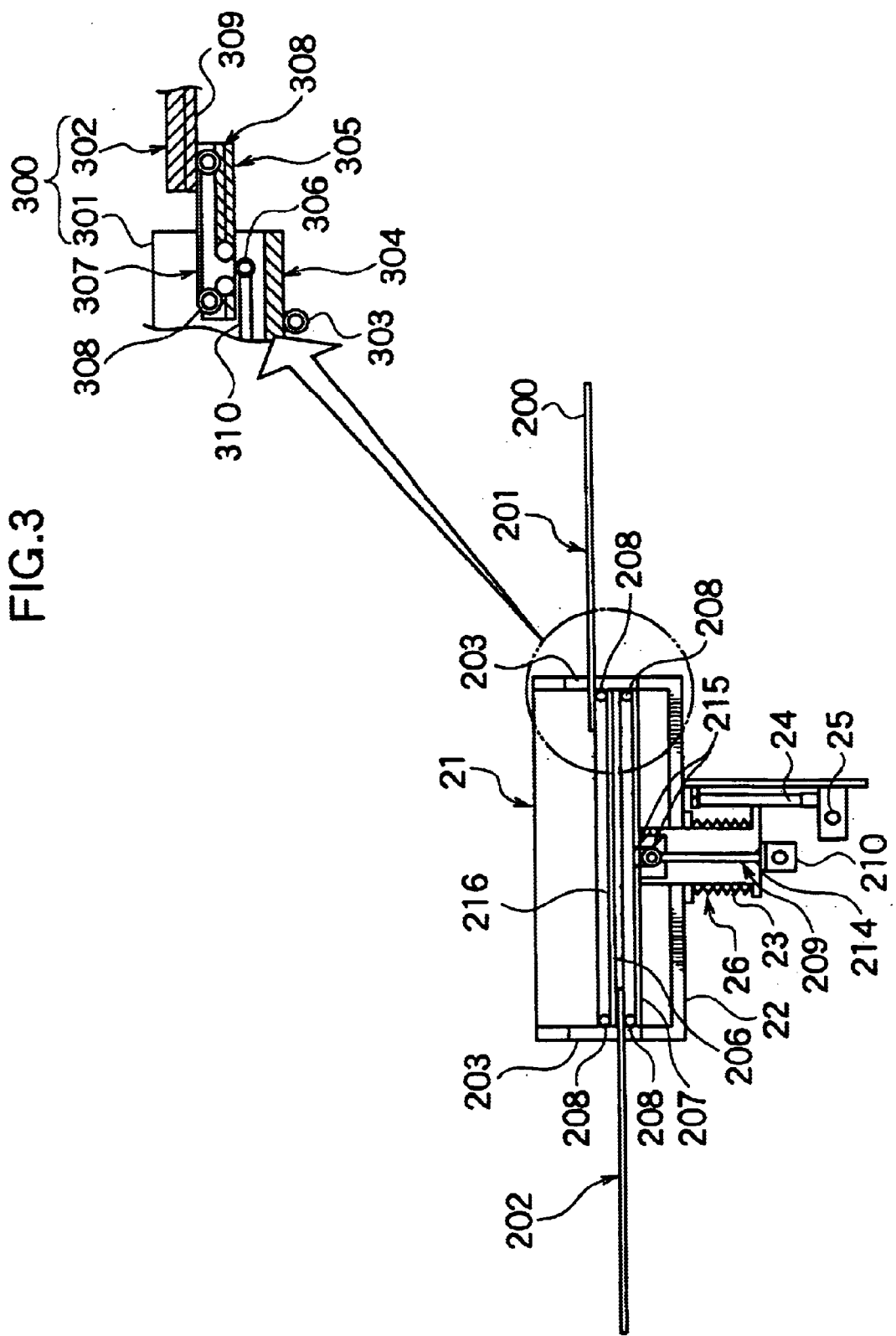
FIG. 3 is a front cross section depicting a conceptual diagram of the substrate conveyance mechanism according to an embodiment, and a fragmentary expanded view of a linked shrinkable type.

FIGS. 2 and 3 depict specific examples of the conveyance mechanism unit 21 disposed inside the vacuum conveyance chamber T2. The container-shaped conveyance platform 22 is provided with a two-tier conveyance arm 200 capable of moving in a rectilinear reciprocating fashion in mutually opposite (right and left) directions. The two upper and lower arms 201 and 202 form a group consisting of two components having a mutually parallel configuration for supporting LCD substrates U on both sides and horizontally conveying these LCD substrates U. The two upper and lower arms 201 and 202 perform a rectilinear reciprocating motion or telescoping motion such that they exit through one of the openings 203 in the right and left side walls of the conveyance platform 22, extend into one of the vacuum chambers, retract back into the conveyance platform 22, re-exit through the other opening 203, extend into the other vacuum chamber, and retract back into the conveyance platform 22.

A linear guide rail 204 and a rack gear 205 are provided in a parallel fashion underneath the arms 201 and 202 on the arm side in order to allow such a rectilinear reciprocating motion to be performed. Two bases 206 and 207 positioned one above the other are provided inside the conveyance platform 22 on the side of this conveyance platform, and pinion gears 208 are provided to the two ends of the bases 206 and 207. The linear guide rail 204 provided underneath the arms 201 and 202 is inseparably embedded in linear guides 217 provided to the bases 206 and 207, allowing the two upper/lower arms 201 and 202 to slide in the linear guides 217. Providing arms that are capable of moving in a reciprocating rectilinear fashion on the linear guides 217 dispenses with the need for a rotary mechanism and results in a simpler mechanism, making it possible to markedly reduce costs.

A main drive shaft 209 passes through the lifting shaft 23 in the axial direction, the main drive shaft 209 is rotated by a reciprocally rotating motor 210 that operates as a single drive source, and this rotation is transmitted by means of a bevel gear 211 disposed inside the conveyance platform 22 in such a way that two horizontal driven shafts 212 and 213 extending in two opposite directions rotate in two mutually opposite directions. The main drive shaft 209 is sealed by magnetic fluid 214 in the bottom portion of the lifting shaft 23.

The horizontal driven shafts 212 and 213 rotate pulleys 215, and this rotation is transmitted by a timing belt 216 via a linkage shaft 218 to the pinion gears 208 provided to both ends of the two bases 206 and 207 positioned one above the other. The rotation of the pinion gears 208 is transmitted via the rack gear 205 to the two arms 201 and 202 positioned one above the other, and the movement of the two arms 201 and 202 becomes an interlocked reciprocal rectilinear movement. As the arms 201 and 202 pass through the conveyance platform 22, the rack gear 205 moves from the pinion gear 208 on one end of the bases 206 and 207 to the pinion gear 208 on the other end. The arms 201 and 202 can thus move concurrently in mutually opposite directions as a result of the fact that motive force is transmitted from the main drive shaft to two driven shafts, which are rotated in mutually opposite directions by a bevel gear.

The arms 201 and 202 should be configured as multistage linked shrinkable types when the stroke of these arms 201 and 202 is insufficient for the above-described conveyance mechanism unit 21. The linked shrinkable conveyance mechanism in the expanded insert indicated by the arrow in FIG. 3 pertains to a case in which an arm 300, which corresponds to the arm 201 or 202, is itself configured as a two-stage structure. This structure comprises a first (lower) arm 301, which is moved in a straight line by a first arm pinion gear 303 (this gear corresponds to a pinion gear 208) through the agency of a rack gear 304, and a second (upper) arm 302, which is interlocked with the first arm 301 via a coupling arm 305.

Rotation of the first arm pinion gear 303 advances the first arm 301 via the rack gear 304, a second arm pulley 306 is rotated by a timing belt 310 in the course of this advance, and this rotation is transmitted by a second arm timing belt 307 to the second arm pinion gears 308 on both ends of the coupling arm 305. Rotation of the second arm pinion gears 308 is transmitted to the second (upper) arm 302 via a rack gear 309. Consequently, extending the first arm 301 causes the second arm 302 to be extended in an interlocked fashion, whereas contracting the first arm 301 causes the second arm 302 to be contracted in an interlocked fashion, thus extending the stroke of the rectilinear motion.

In FIG. 1, the following options can be proposed for the substrate preparation chamber when two substrate conveying units are lined up and the substrates are conveyed simultaneously: (1) a single-tier configuration may be adopted for the slot serving as a substrate storage unit. (2) the slot may have a two-tier configuration made up of upper and lower mechanisms, and (3) the upper and lower structures may be disposed on the side of the substrate conveying unit in the manner described in the above embodiment, and the substrate conveyance slot may have a two-tier configuration devoid of an upper or lower mechanism.

In (1), heating and cooling must be performed using the same slot, so measures must be taken to prevent the slot from being heated. Such heating prevention is difficult to achieve, however. If the slot is heated, then it must be cooled, which results in a lower throughput. Lamp heating must be adopted in order to suppress such heating, but lamp heating can be problematic in terms of temperature control, particularly at low temperatures. In addition, such heating has a precipitous heat cycle and produces particulate matter.

In (2), the equipment is more expensive to manufacture because the substrate preparation chamber must be provided with upper and lower mechanisms for moving the two-tier slot up and down.

Embodiment (3) allows equipment to be manufactured less expensively because upper and lower mechanisms for moving substrates U do not need to be provided on the side of the substrate preparation chamber. In addition, partitioning the heating slot and the cooling slot with a reflecting plate 15 keeps each slot at a substantially constant temperature, making it possible to expect that the amount of particles in the substrate preparation chamber will decrease, temperature stability will be achieved at lower temperatures, and the throughput will be increased.

Figure 4:
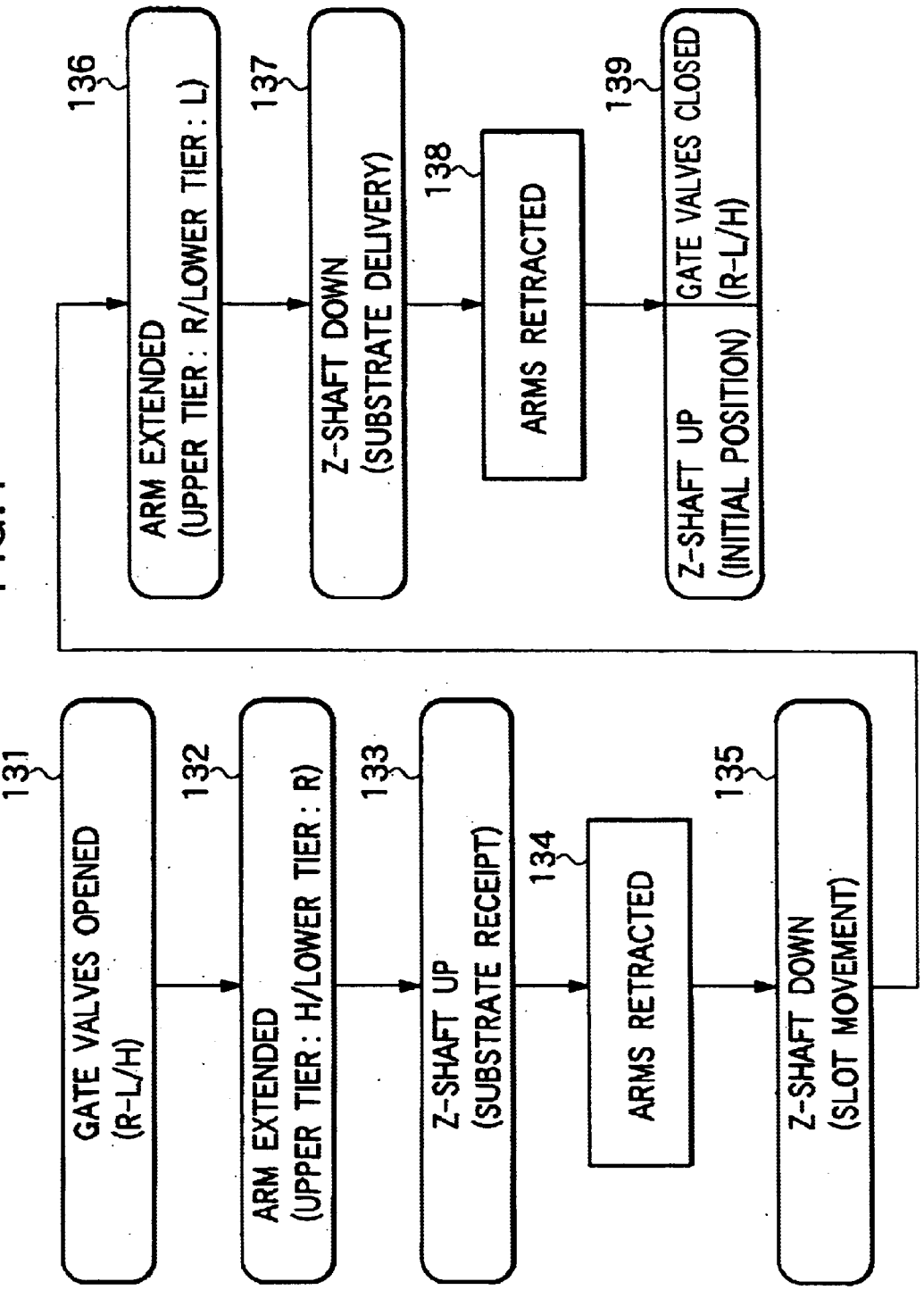
FIG. 4 is a flowchart depicting a conveyance sequence according to an embodiment.

The substrate conveyance sequence of a CVD device will now be described with reference to FIG. 4. The gate valves G2 and G3 of the film-forming chamber R and substrate preparation chamber L/H are first opened (step 131). Once the gate valves G2 and G3 are open, the conveyance arm Z00 is extended such that the upper arm 201 is inserted into the unprocessed substrate receiving slot H of the substrate preparation chamber L/H, and the lower arm 202 is inserted into the reaction chamber R (step 132). The lifting shaft 23 of the vacuum conveyance chamber T2 is raised such that the unprocessed substrate U1 supported by the support pins 13 of the unprocessed substrate receiving slot H is received by the upper arm 201, and the processed substrate U2 supported by the support pins 32 of the reaction chamber R is received by the lower arm 202 (step 133).

The upper and lower arms 201 and 202 carrying the substrates U1 and U2 are temporarily retracted into the conveyance platform 22 (step 134), the lifting shaft 23 of the vacuum conveyance chamber T2 is lowered, and the two arms 201 and 202 are brought to a height corresponding to the insertion positions of the reaction chamber R and the unprocessed substrate receiving slot L for receiving these arms (step 135). After the components have been set to the same height, the conveyance arm 200 is extended such that the upper arm 201 is inserted into the reaction chamber R, and the lower arm 202 is inserted into the processed substrate receiving slot L (step 136). The lifting shaft 23 is lowered following insertion, the processed substrate U2 on the lower arm 202 is delivered to the support pins 16 of the processed substrate receiving slot L, and unprocessed substrate U1 on the upper arm 201 is delivered to the support pins 32 of the reaction chamber R (step 137). After the delivery is completed, the upper and lower arms 201 and 202 are retracted (step 138) into the vacuum conveyance chamber T2, the lifting shaft 23 is raised, the upper and lower arms 201 and 202 are returned to the initial or standby positions, and the gate valves G2 and G3 of the reaction chamber R and substrate preparation chamber L/H are closed (step 139).

Figure 5:
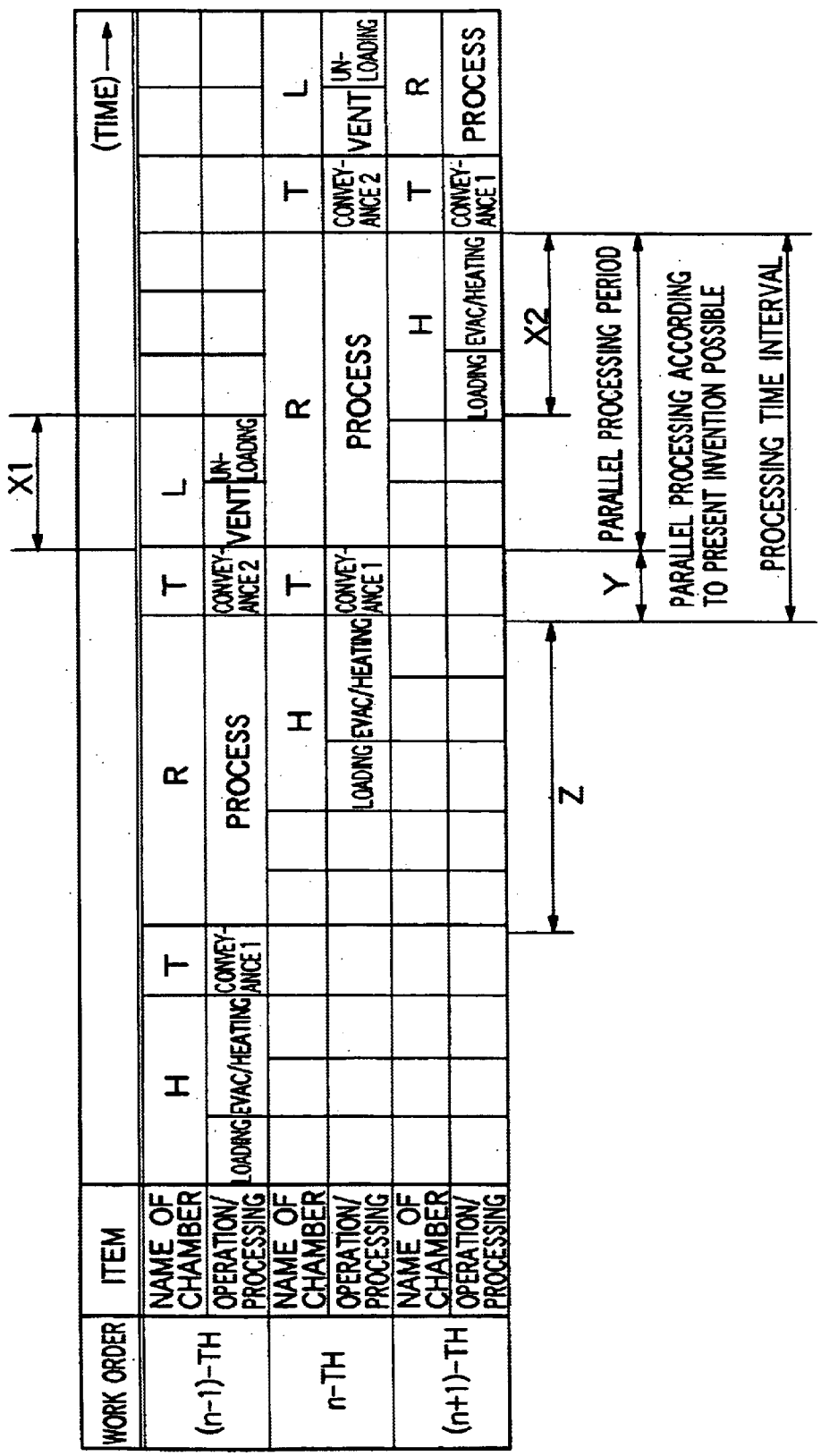
FIG. 5 is a timing chart illustrating a process flow for an LCD substrate according to an embodiment.

FIG. 5 shown the process flow for the LCD substrates of the above-described CVD device comprising a substrate preparation chamber L/H having two-tier slots H and L, and a vacuum conveyance chamber T2 having two-tier arms 201 and 202. The symbols used in FIG. 5 have the following meaning.

| | |
|---|---|
| H: | Unprocessed substrate receiving slot |
| L: | Processed substrate receiving slot |
| T: | Vacuum conveyance chamber |
| R: | Film-forming chamber |
| Load: | Substrate loading (into unprocessed substrate receiving slot H) |
| Unload: | Substrate unloading (from unprocessed substrate receiving slot L) |
| Evac: | Evacuation of substrate preparation chamber |
| Vent: | Venting of substrate preparation chamber |
| Heating: | Preheating of substrates in the unprocessed substrate receiving slot H of substrate preparation chamber |
| Conveyance 1: | Conveyance of substrates from unprocessed substrate receiving slot H to film-forming chamber R |
| Conveyance 2: | Conveyance of substrates from film-forming chamber R to processed substrate receiving slot L |

The (n−1)-th unprocessed substrate U1 is loaded into the slot H of the substrate preparation chamber L/H, the substrate preparation chamber L/H is evacuated (Evac), and the substrate U1 is heated to a proscribed temperatures The unprocessed substrate U1 is conveyed (conveyance 1) to the film-forming chamber R by the upper arm 201 of the vacuum conveyance chamber T2. Prescribed processing is performed in the film-forming chamber R. Before this processing is completed, the n-th unprocessed substrate U1 is loaded into the substrate preparation chamber L/H, and the substrate preparation chamber L/H is evacuated (Evac) and heated to a prescribed temperature. The end time of heating and the end time of processing are coordinated.

After both the heating and the processing have been completed, the (n−1)-th processed substrate U2 is conveyed by the lower arm 202 of the vacuum conveyance chamber T2 from the film-forming chamber R to the slot L of the substrate preparation chamber L/H (conveyance 2), and the n-th unprocessed substrate U1 previously loaded by the upper arm 201 is conveyed to the film-forming chamber R (conveyance 1). The structure of the embodiment allows these two acts of conveyance 1 and 2 to be performed simultaneously as parallel processing.

After the (n−1)-th unprocessed substrate U2 has been conveyed to the substrate preparation chamber L/H, the substrate preparation chamber L/H is vented to the atmosphere (Vent), and the substrate is unloaded outside by the atmospheric conveyance robot B through the slot L of the substrate preparation chamber L/H. In addition, prescribed processing is performed in the film-forming chamber R at the same time as the substrate preparation chamber L/H is vented to the atmosphere after the n-th unprocessed substrate U1. has been conveyed to the film-forming chamber R. Before this processing is completed, the (n+1)-th unprocessed substrate U1 is loaded into the slot H of the substrate preparation chamber L/H, and the substrate preparation chamber L/H is evacuated (Evac) and heated to a prescribed temperature. The end time of heating and the end time of processing are coordinated. The (n−1)th preparation and unloading routines and the first half of the processing routine involving the n-th substrate represent simultaneously performed parallel routines, as do the (n+1)-th loading and preparation routines and the second half of the n-th processing routine (that is, the processing routine and the preparation-unloading routine/loading-preparation routine).

After both the processing routine involving the n-tb substrate and the heating routine involving the (n+1)-th substrate have been completed, the n-th unprocessed substrate U2 is conveyed from the film-forming chamber R to the slot L of the substrate preparation chamber L/H by the lower arm 202 of the vacuum conveyance chamber T2 (conveyance 2), and the (n+1)-th unprocessed substrate U1 is conveyed from the slot H of the substrate preparation chamber L/H to the film-forming chamber R by the upper arm 201 (conveyance 1). The structure of the embodiment allows these two acts of conveyance 1 and 2 to be performed simultaneously as parallel processing.

After the (n−1)-th processed substrate U2 has been conveyed to the substrate preparation chamber L/H, the substrate preparation chamber L/H is vented to the atmosphere (Vent), and the substrate is unloaded outside by the atmospheric conveyance robot B through the slot L of the substrate preparation chamber L/H. In addition, prescribed processing is started in the film-forming chamber R at the same time as the substrate preparation chamber LSH is vented to the atmosphere after the (n+1)-th unprocessed substrate U1 has been conveyed to the film-forming chamber R.

The routine (referred to as "the processing time interval") performed between one act of conveyance (conveyance 2/conveyance 1) and the other act of conveyance (conveyance 2/conveyance 1) is repeated thereafter.

Figure 6:
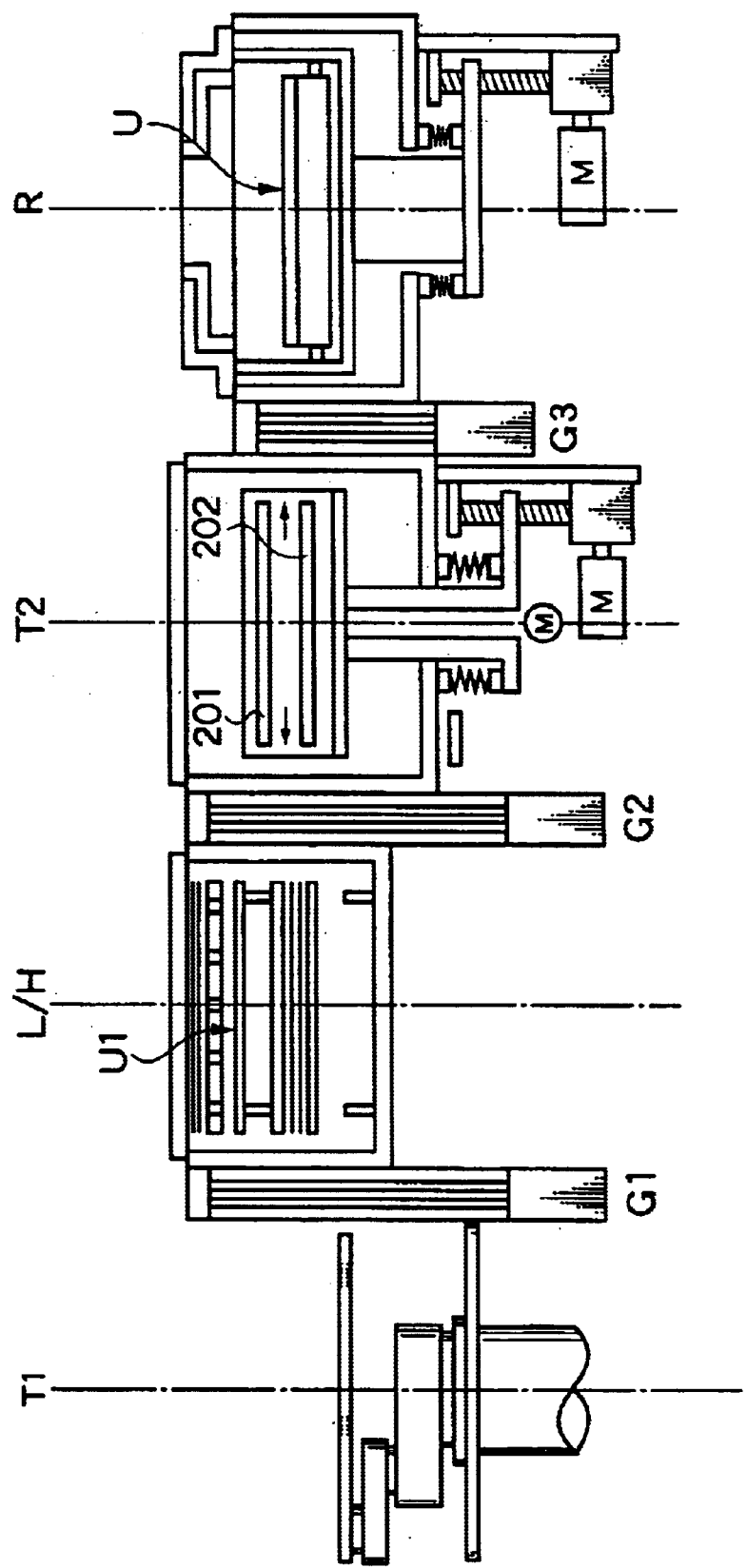
FIG. 6 is a diagram illustrating a film-forming process according to an embodiment.
Figure 9:
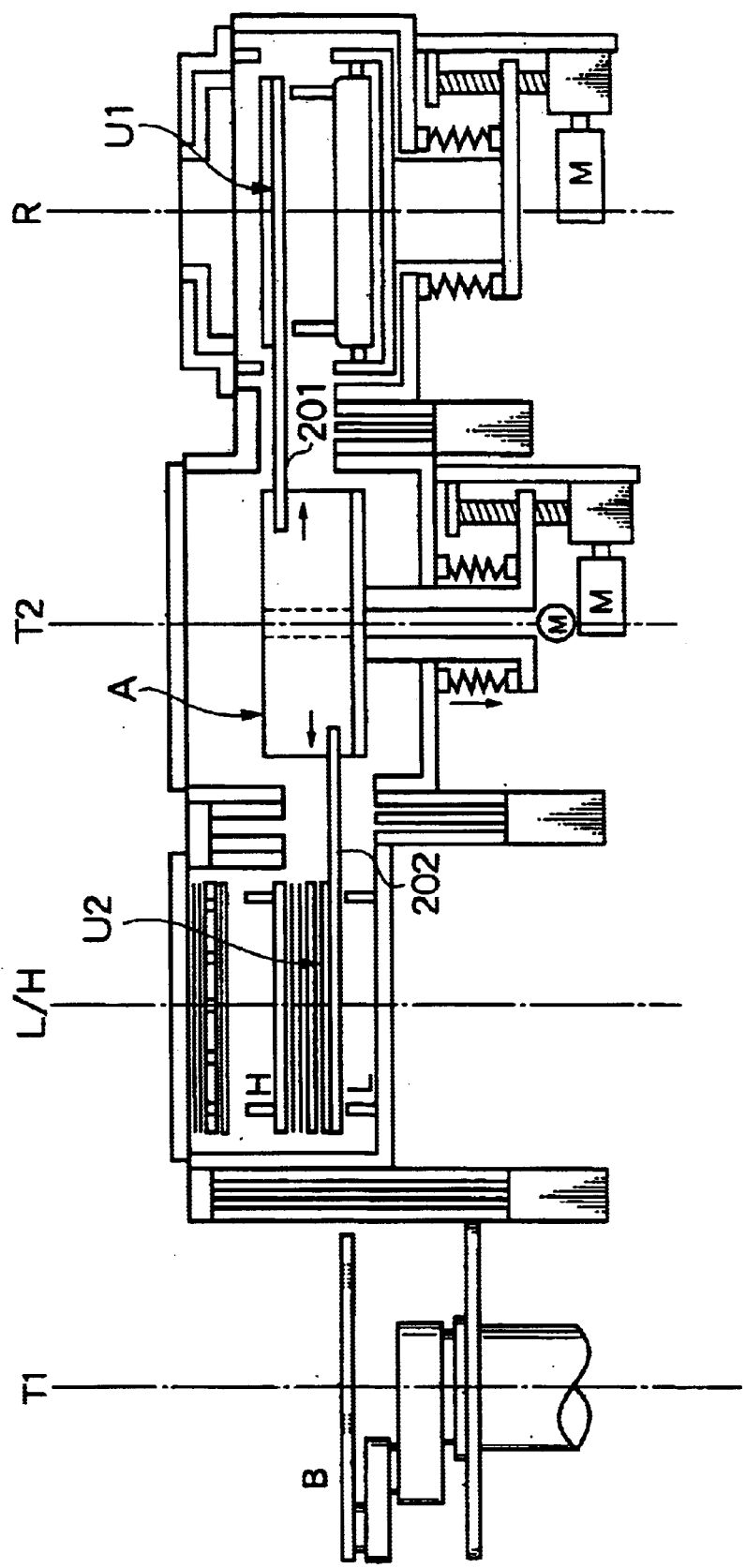
FIG. 9 is a diagram illustrating the removal of a processed substrate according to an embodiment.
Figure 10:
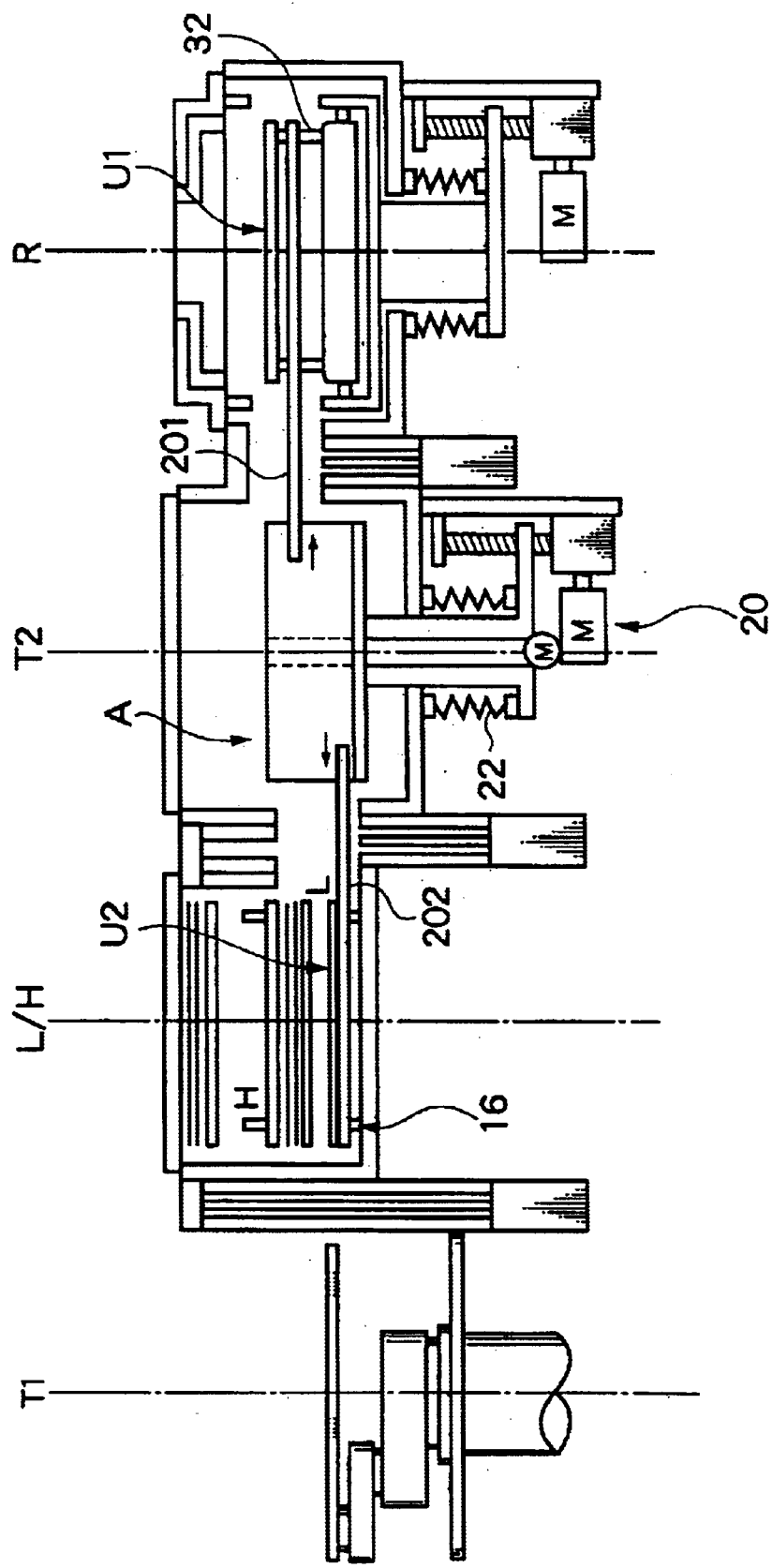
FIG. 10 is a diagram illustrating receipt of a substrate by the film-forming chamber according to an embodiment.

Operation of an LCD CVD device will now be described in further detail with reference to FIGS. 6 to 10. This operation involves the sequential steps of film forming, substrate conveyance following film forming, and new substrate introduction. FIG. 6 depicts film forming, FIG. 7 depicts receipt of an unprocessed substrate from the film-forming chamber, FIG. 8 depicts removal of an unprocessed substrate, FIG. 9 depicts introduction of an unprocessed substrate into the film-forming chamber, and FIG. 10 depicts receipt of the substrate by the film-forming chamber.

During film forming, all the gate valves G1 to G3 are closed, as shown in FIG. 6. In the film-forming chamber R, a substrate U is in the process of being formed. In the vacuum conveyance chamber T2, the arms 201 and 202 retract and assume a standby state. In the substrate preparation chamber L/H, the unprocessed substrate U1 received by the unprocessed substrate receiving slot H is in the process of being preheated.

Figure 7:
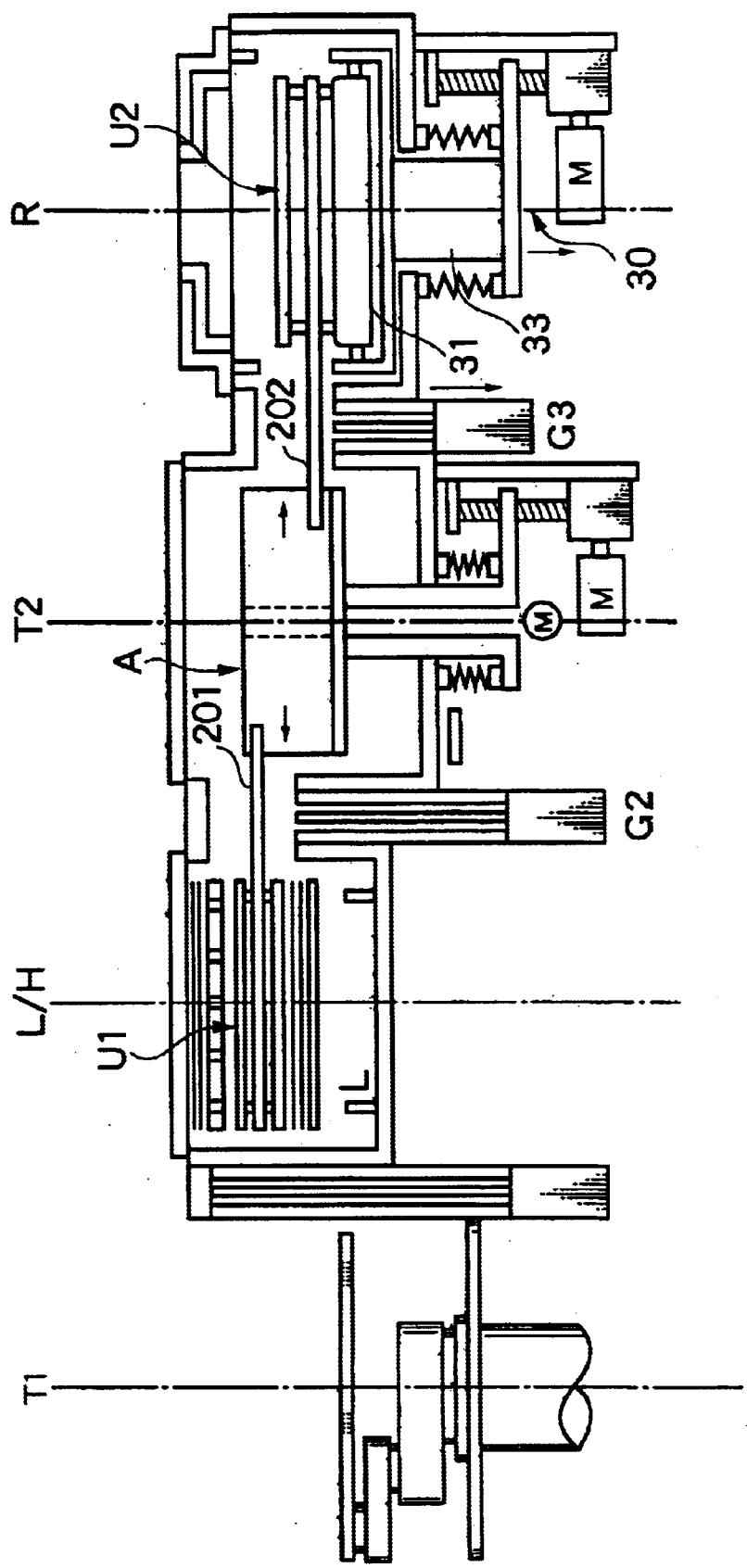
FIG. 7 is a diagram illustrating the receipt of a processed substrate from a film-forming chamber according to an embodiment.

Once a film has been formed, the second and third gate valves G2 and G3 are opened, the lifting mechanism 30 of the film-forming chamber R is actuated, and the lifting shaft 33 is lowered, as shown in FIG. 7. The processed substrate U2 is thus lifted off the substrate mounting platform 31. The vacuum conveyance robot A is actuated, the empty lower arm 202 is extended from the vacuum conveyance chamber T2 into the film-forming chamber R and slid underneath the processed substrate U2, and the empty upper arm 201 is slid underneath the unprocessed substrate U1 of the unprocessed substrate receiving slot H inside the substrate preparation chamber L/H. In the drawing, the film-forming chamber R is shown in its pre-delivery state, the vacuum conveyance chamber T2 in a pre-receipt state during removal, and the substrate preparation chamber L/H in a state existing prior to delivery through the unprocessed substrate receiving slot H.

Figure 8:
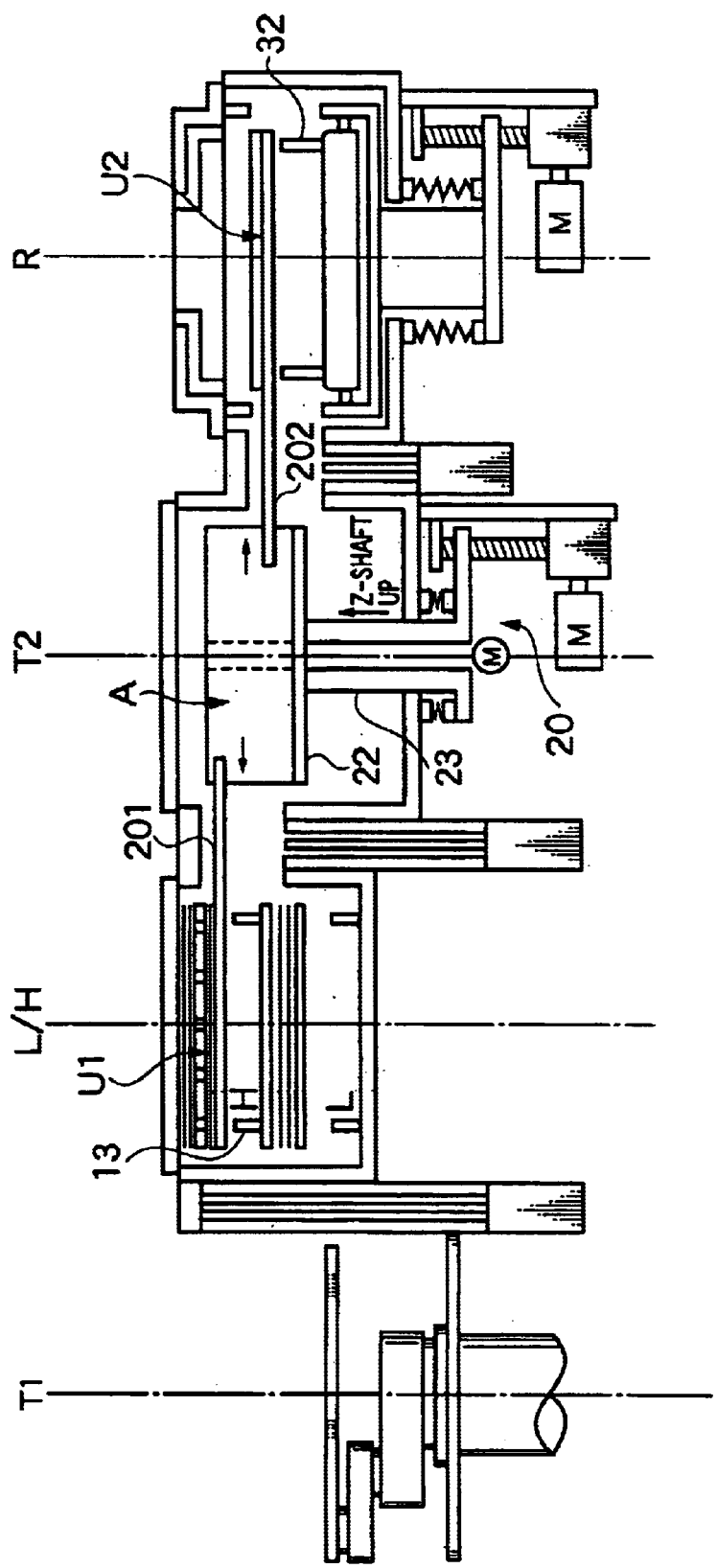
FIG. 8 is a diagram illustrating the introduction of an unprocessed substrate into the film-forming chamber according to an embodiment.

Once the two arms 201 and 202 are slid underneath the substrates U1 and U2, the lifting mechanism 20 of the vacuum conveyance chamber T2 is actuated, the lifting shaft 23 is raised, and the two arms 201 and 202 are also raised, as shown in FIG. 8. The lower arm 202 receives the unprocessed substrate U1 from the substrate support pins 32 in the film-forming chamber R, and the upper arm 201 receives the unprocessed substrate U1 from the substrate support pins 13 in the unprocessed substrate receiving slot H of the substrate preparation chamber L/H. These acts of receipt can be performed simultaneously because of a near perfect match between the difference $\alpha$ in height between the unprocessed substrate storage unit of the substrate preparation chamber and the substrate mounting unit of the film-forming chamber, and the difference $\gamma$ in height between the arms. In the drawing, the film-forming chamber R is shown in its post-delivery state, the vacuum conveyance chamber T2 in a post-receipt state during removal, and the substrate preparation chamber L/H in a state existing following delivery through the unprocessed substrate receiving slot H.

Once the arms 201 and 202 receive the substrates U, these two arms 201 and 202 are contracted and temporarily returned to their standby positions in the conveyance platform 22, whereupon the lifting mechanism 20 of the vacuum conveyance chamber T2 is actuated, and the vacuum conveyance robot A is lowered to a proscribed position. After being lowered, the vacuum conveyance robot A is actuated, and the two arms 201 and 202 are extended in opposite directions, as shown in FIG. 9. The upper arm 201 extends from the substrate preparation chamber L/H into the film-forming chamber R and introduces the unprocessed substrate U1 into the film-forming chamber R, while the lower arm 202 extends from the film-forming chamber R to the substrate preparation chamber L/H and introduces the processed substrate U2 into the processed substrate receiving slot L. In the drawing, the film-forming chamber R is shown in its pre-receipt state, the vacuum conveyance chamber. T2 in a pre-delivery state during introduction, and the substrate preparation chamber L/H in a state existing prior to receipt through the processed substrate receiving slot L.

Once the two arms 201 and 202 are inserted into the chambers R and L/H, the lifting mechanism 20 of the vacuum conveyance chamber T2 is actuated, the lifting shaft 23 is lowered, and the two arms 201 and 202 are also lowered, as shown in FIG. 10. The substrate support pins 32 of the film-forming chamber R receive the unprocessed substrate U1 from the upper arm 201, and the substrate support pins 16 of the unprocessed substrate receiving slot L of the substrate preparation chamber L/H receive the processed substrate U2 from the lower arm 202. These acts of receipt can also be performed simultaneously because of a near perfect match between the difference $\alpha$ in height between the processed substrate storage unit of the substrate preparation chamber and the substrate mounting unit of the film-forming chamber, and the difference γ in height between the arms. In the drawing, the film-forming chamber R is shown in its post-delivery state, the vacuum conveyance chamber T2 in a post-delivery state during removal, and the substrate preparation chamber L/H in a state existing following delivery through the processed substrate receiving slot L.

The device is thus provided with a substrate preparation chamber L/H capable of accommodating a two-tier arrangement consisting of an unprocessed substrate U1 and a processed substrate U2, and with a vacuum conveyance robot A that comprises two arms 201 and 202 capable of rectilinearly moving in mutually opposite directions and simultaneously accessing the film-forming chamber R and substrate preparation chamber L/H on the two sides of the second conveyance chamber T2, making it possible to perform parallel processing in which the processed substrate U2 formed in the film-forming chamber R is removed from the film-forming chamber R while the unprocessed substrate U1 is removed from the substrate preparation chamber L/H, and in which the unprocessed substrate U1 is introduced into the film-forming chamber R while the processed substrate U2 is introduced into the substrate preparation chamber L/H.

In the embodiment described above, the substrate preparation chamber was provided with two or more substrate storage units referred to as unprocessed substrate receiving slots and processed substrate receiving slots capable of receiving unprocessed substrates and processed substrates at the same time, with the result that evacuation and atmospheric venting can be performed substantially concurrently during processing, and that the processing time interval (substrate process cycle) can be markedly reduced.

When Z is shorter than the usual interval X=X1+X2, the corresponding processing time interval can be expressed as $$X+Y+Z \tag{1}$$

where X1 is the preparation chamber atmospheric venting time+the substrate unloading time, X2 is the substrate unloading time+the preparation chamber evacuation and heating time, Y is the time needed to convey a substrate from the substrate preparation chamber to the film-forming chamber (conveyance 1) or the time needed to convey a substrate from the film-forming chamber to the substrate preparation chamber (conveyance 2), and Z is the film-(forming chamber processing time, as shown in FIG. 5.

In a reverse case, that is, when Z is greater than X, the processing time interval can be expressed as $$Y+Z \tag{2}$$

and the time X can be reduced.

In addition, the time Y can be reduced, and the processing time interval shortened because substrates can be conveyed from the substrate preparation chamber to the film-forming chamber (conveyance 1) at the same time as being conveyed from the film-forming chamber to the substrate preparation chamber (conveyance 2), The first means of simplifying the conveyance mechanism (reducing the number of drive shafts) in order to trim down costs is to adopt an axial arrangement for the chambers, making it possible to convey substrates Solely by rectilinear operation without the need to rotate the conveyance mechanism. A rack gear is provided underneath the arms, and pinion gears interlinked with a timing belt are provided at the two ends of moving bases, allowing the rack to perform a reciprocating conveyance operation by moving between the pinion gears. Next, a lower arm and an upper arm must be provided, and the arms must be operated in mutually different directions in order to convey substrates simultaneously in two directions. Because this operation can be performed in a sustained manner such that components move in opposite directions at the same time, the drive source and the main drive shaft can be combined into a single component, and the rotation can be transmitted to two driven shafts rotated in mutually opposite directions by a bevel gear, making it possible to achieve the above-described object by interlocking the movements of the two arms.

Operation of the other modules (substrate preparation chamber, film-forming chamber) involved in conveyance can be dispensed with because operation of a conveyance mechanism alone is sufficient to complete a series of conveyance operations by defining the relation between the height of the slot inside the substrate preparation chamber, the pitch between the arms of the substrate conveyance mechanism, and the height at which the substrates are mounted in the film-forming chamber. Conveyance time can thus be reduced and the throughput increased.

Whereas achieving higher throughput in a conventional substrate preparation chamber requires providing a plurality of slots, and hence equipping the chamber with a longer-stroke lifting mechanism, the present device can adequately operate at a substrate heating capacity on a par with that of a single film-forming chamber. Increasing the efficiency of the above-described processing method makes it possible to use a single unprocessed substrate receiving slot under normal conditions. It is also sufficient to use a single processed substrate receiving slot under ordinary conditions because the only limiting condition is the evacuation and atmospheric venting time. When the device is composed of a single unprocessed substrate receiving slot and a single processed substrate receiving slot in such a manner, adopting a two-tier conveyance mechanism dispenses with the need to provide the substrate preparation chamber with a lifting mechanism and simplifies the structure, making it possible to achieve a marked reduction in cost.

Although the above embodiment was described with reference to an in-line arrangement having a single film-forming chamber, the same reasoning applies to an arrangement having two or more film-forming chambers. This arrangement can be obtained by providing a second vacuum conveyance chamber subsequent to a first film-forming chamber, and connecting a second film-forming chamber to a second vacuum conveyance chamber. Such a uniaxially configured substrate processing device eliminates waste in terms of cost and footprint and is an efficient substrate processing device sufficiently flexible to be adapted to various desired throughput levels.

Although the present invention was described with reference to an LCD substrate processing device, it can also be adapted to a semiconductor substrate processing device. In addition, the conveyance arm had a two-tier structure, but a multi-tier structure is also acceptable in principle.

Figure 11:
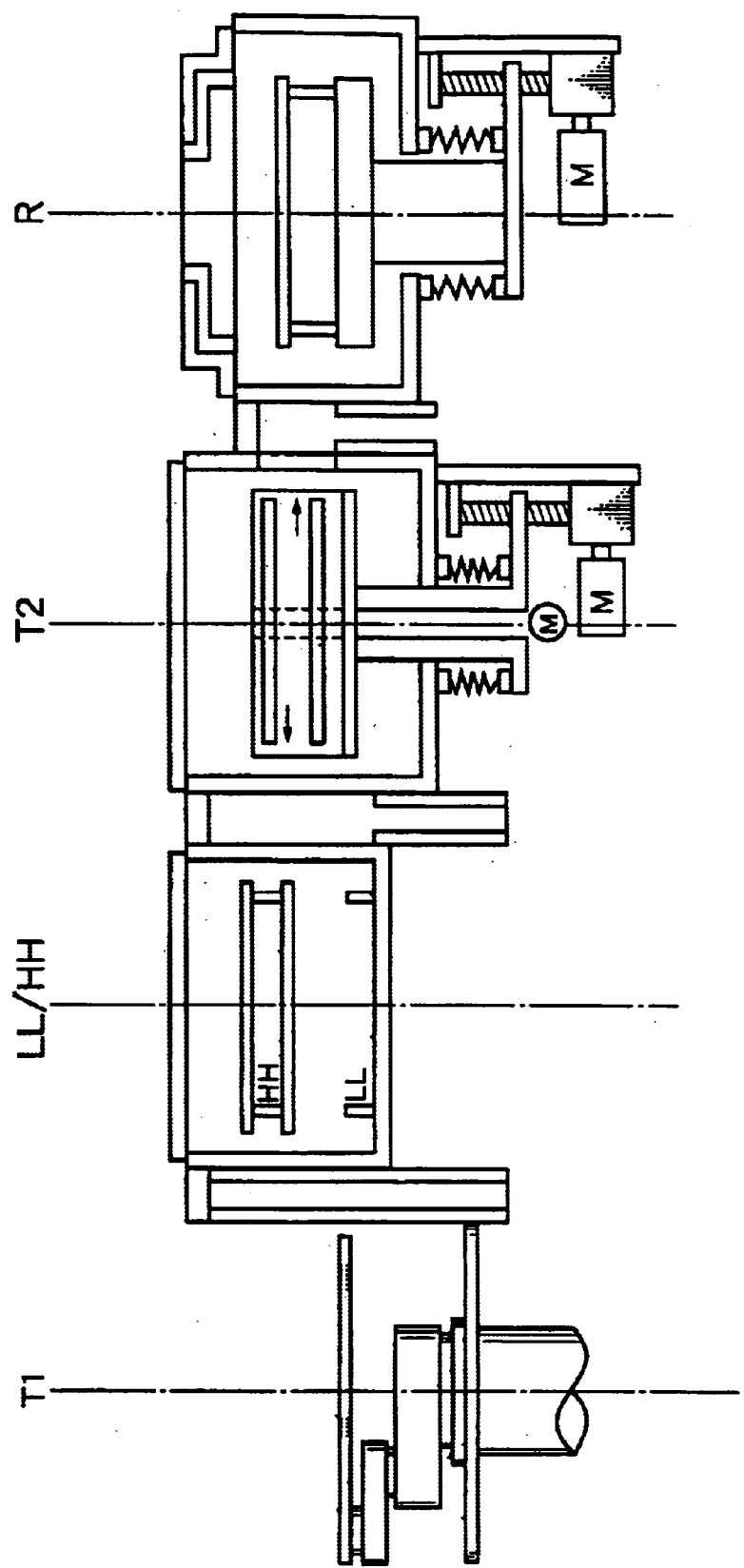
FIG. 11 is structural diagram of an etching device or ashing device according to an embodiment.

Furthermore, the arrangement described above involved a CVD device whose substrate preparation chamber L/H comprised an unprocessed substrate receiving slot L and a processed substrate receiving slot L, but the present invention is also applicable to sputtering devices, dry etching devices, and ashing devices. A dry etching device or an ashing device does not require preheating, making it possible to dispense with the use of a heating mechanism for the CVD device and to employ a substrate preparation chamber LL/HH whose slots HH and LL have a two-tier structure devoid of a heating mechanism, as shown in FIG. 11. In this case, the vacuum conveyance chamber T2 and the film-forming chamber R remain the same.

The above embodiment was described with reference to a substrate storage unit in which unprocessed substrates are disposed at the top, and processed substrates at the bottom, but the present invention is not limited thereby. The vertical arrangement can be reversed, and a corresponding conveyance arrangement can be adopted.

Figure 12:
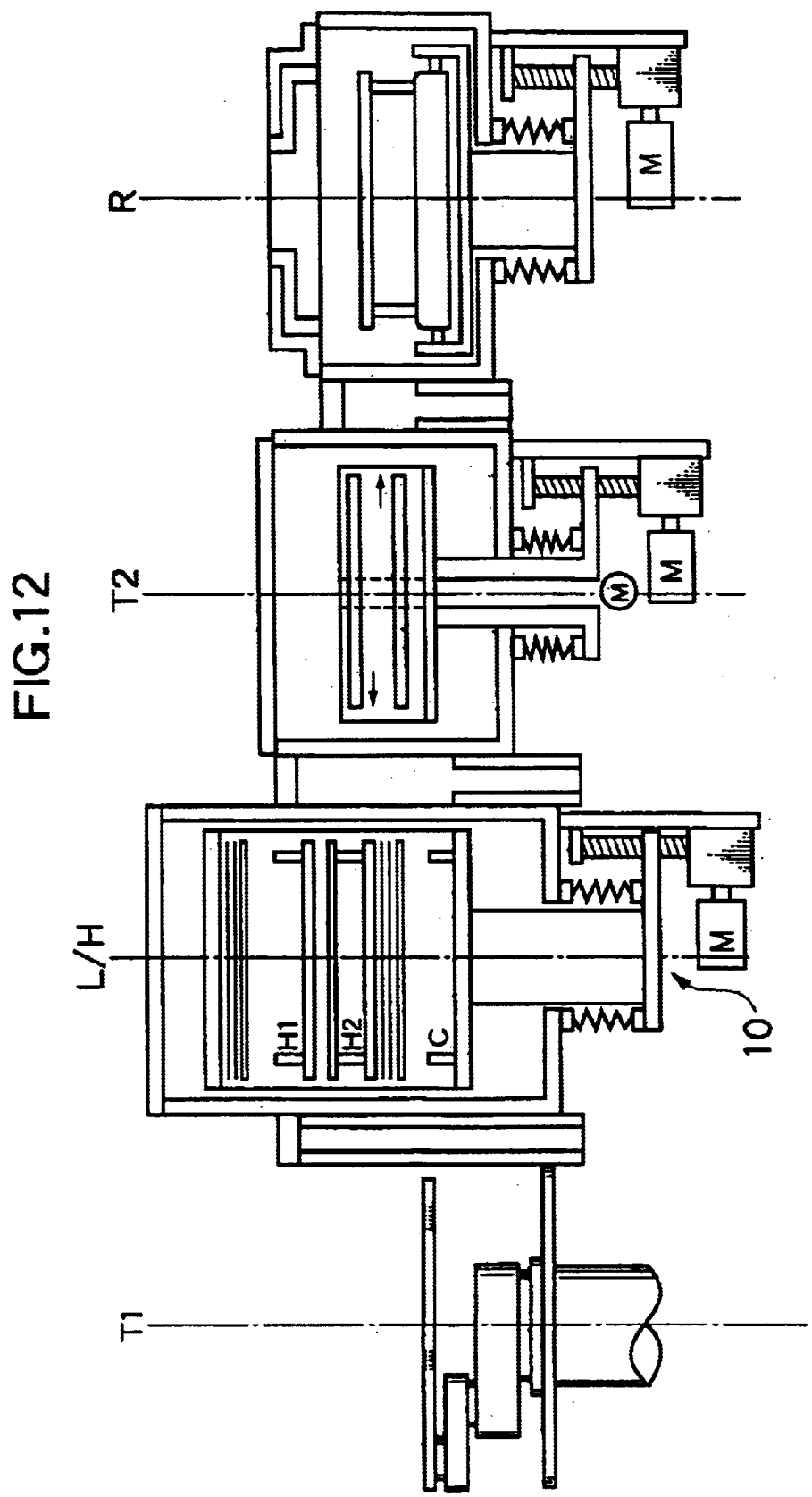
FIG. 12 is a structural diagram of a CVD device or sputtering device with multi-tier heating slots (loading slots) according to an embodiment.

When the processing time of a film-forming chamber in a CVD device or sputtering device is less than the usual preparation time needed to process a substrate (this time is the sum of the following intervals: preparation chamber, atmospheric venting time, substrate unloading time, substrate loading time, and preparation chamber venting and heating time), the time needed to perform a heating routine becomes the limiting factor for the processing time interval of the device, and the processing time interval is increased in the manner described above. To address this problem by reducing the processing time interval, a plurality (H1, H2) of unprocessed substrate receiving slots H may be provided to the substrate preparation chamber L/H in the manner shown in FIG. 12, making it possible to reverse the temporal relation and to reduce the processing time interval. In this case, a lifting mechanism 10 is needed to raise and lower the unprocessed substrate receiving/processed substrate receiving slots H1, H2, and L.

The above embodiment was described with reference to a case in which a simplified structure was adopted for the substrate preparation chamber L/H. A more detailed structure will now be described.

Figure 13:
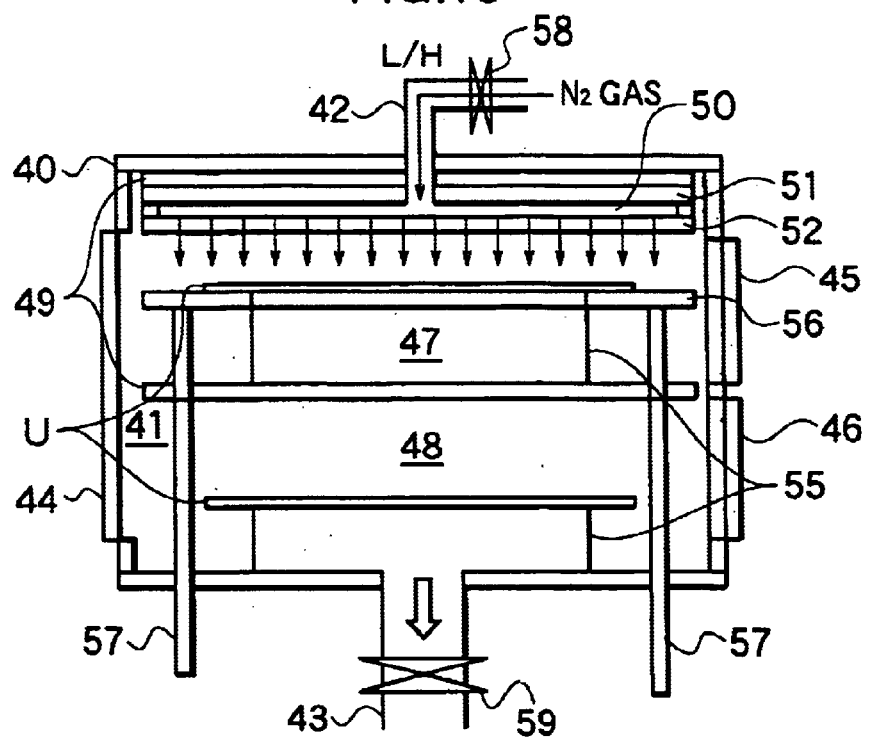
FIG. 13 is a specific structural diagram of a substrate preparation chamber according to an embodiment.
Figure 14:
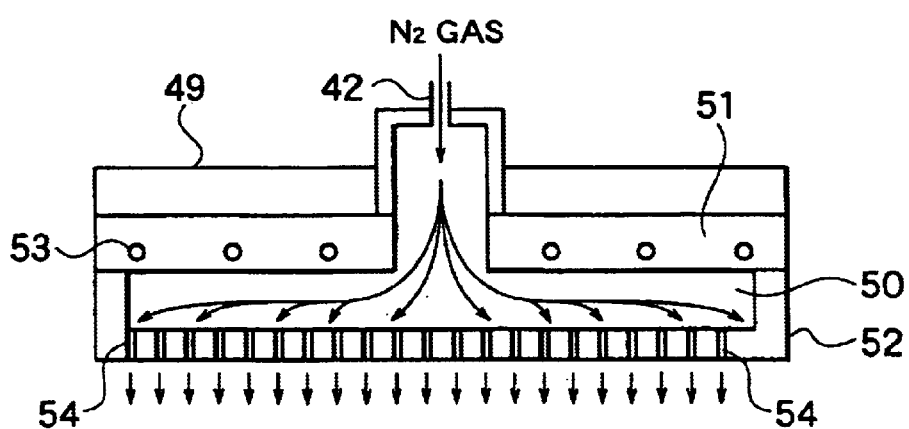
FIG. 14 is an expanded view of the gas-heating unit of the substrate preparation chamber shown in FIG. 13.

As shown in FIG. 13, a substrate preparation chamber L/H (load lock chamber) is enclosed in a external chamber wall 40. The ceiling portion of the external wall is provided with an $N_2$ gas introduction unit 42 for introducing Na gas into the chamber 41, and the bottom portion is provided with an exhaust port 43 for discharging the $N_2$ gas thus introduced. The left-side portion of the external wall is provided with an atmospheric-side gate valve 44, the top part of the right-side portion is provided with a gate valve 45 on the Side of the H-chamber, and the bottom part is provided with a gate valve 46 on the side of the L-chamber. The interior is provided with an H-chamber 47 serving as a heating slot, and an L-chamber 48 serving as a cooling slot, and the H-chamber 47 and L-chamber 48 are separated into two tiers by a centrally located heat-insulating member 49. The gate valve 45 on the side of the H-chamber is made to correspond to the upper-tier H-chamber 47, and the gate valve 46 on the side of the L-chamber is made to correspond to the lower-tier L-chamber 48. The top portion of the H-chamber 47 is provided with a gas-heating unit 50 for heating the $N_2$ gas. The gas-heating unit 50 is a space formed as a separate compartment by an upper heater 51 and a shower plate 52. This space is connected to the above-described $N_2$ gas introduction unit 42 in the ceiling portion of the external wall. The upper heater 51 is provided with a heat-insulating member 49 covering the heater and performing the same function as a reflecting plate. As shown in FIG. 14, the upper heater 51 is composed of a plate member containing an embedded heating wire 53, and the shower plate 52 is provided with numerous holes 54 for diffusing the $N_2$ gas and introducing it into the chamber 41.

A substrate U introduced into the H-chamber 47 is supported by a plurality of substrate support pins 55 and is heated in the H-chamber 47 by contact with a lower heater 56 shaped as a plate. The lower heater 56 is installed such what it can be raised and lowered by a lower heater drive unit 57, coming into contact with the substrate U when raised, and breaking contact with the substrate U when lowered. A substrate U introduced into the L-chamber 48 is supported by a plurality of substrate support pins 55 and is naturally cooled in the L-chamber 48.

In the above-described structure, a substrate U is first introduced into the H-chamber 47 above the L-chamber 48 through the atmospheric-side gate valve 44 and is set on the substrate support pins 55, after which the atmospheric-side gate valve 44 is closed. When the substrate U is to be heated while in contact with the lower heater 56, the lower heater 56 is raised by the lower heater drive unit 57 to a position in which the substrate U is supported by the upper surface of the lower heater 56 at the same time as the atmospheric-side gate valve 44 is closed. At this time, the interior of the chamber 41 is kept at atmospheric pressure.

After it is confirmed that the atmospheric-side gate valve 44 has been closed, $N_2$ gas is admitted into the gas-heating unit 50 through the $N_2$ gas introduction unit 42 by opening an $N_2$ gas valve 58 upstream of the $N_2$ gas introduction unit in the top portion of the chamber 41 (see FIG. 14). Because the gas-heating unit 50 is a space in contact with the lower surface of the upper heater 51, the $N_2$ gas is heated to a high temperature by being passed through this space. The $N_2$ gas heated by the gas-heating unit 50 is passed through and diffused by the shower plate 52 (which performs a gas diffusing function due to its porous structure), and is blown against the entire surface of the substrate U The substrate U, in addition to being heated by the radiation heat transfer of the upper heater 51 and the convective heat transfer of the atmosphere in the chamber 41, is heated with hot $N_2$ gas, which is supplied from the upper heater 51 and is blown against the entire surface of the substrate. It is thus possible to reduce the substrate heating time and to prevent the substrates from being heated nonuniformly.

When a substrate U is placed directly on the upper surface of the lower heater 56, the heating time of the substrate U can be further reduced by adding a heating cycle based on the conduction of heat from the lower heater 56. The pressure inside the chamber 41 is lowered and the interior of the chamber 41 is placed in a state of high vacuum by opening a main exhaust valve 59 and discharging the gas from the chamber 41 through the exhaust port 43 after the substrate U has been heated to the temperature of film forming. It is then confirmed that a high vacuum has been established. The lower heater 56 is then lowered, the gate valve 45 on the side of the H-chamber is opened, the substrate U is conveyed into the film-forming chamber R (referred to merely as "the R-chamber") by the vacuum conveyance robot A in the vacuum conveyance chamber T2 (referred to merely as "the T2-chamber"), and a film is formed in the R-chamber (see FIG. 1). After the film has been completely formed, the substrate U is conveyed back to the L-chamber 48 through the T2-chamber and the gate valve 46 on the side of the L-chamber. The L-chamber 48 is positioned underneath the H-chamber 47, which is partitioned from the H-chamber 47 by the heat-including member 49, so the substrate U is cooled in the L-chamber 48 to a low temperature, the L-chamber 48 is then vented, and the substrate is returned to the substrate cassette C through the atmospheric-side gate valve 44.

The device throughput is speeded up, lower manufacturing costs are achieved, and the surface area of the footprint is reduced by combining the load lock chamber and the substrate heating chamber in such a manner. In addition, device throughput is increased because of a reduction in the number of conveyance cycles performed by the vacuum conveyance robots. Furthermore, the substrate a heating time is reduced and the device throughput is increased by adopting a system in which substrates are heated by being brought into direct contact with a heater under atmospheric conditions. The substrate heating time can also be shortened and temperature variations within the substrate plane reduced by blowing heated $N_2$ gas against the entire surface of the substrate in the heating slot.

The above embodiment was described with reference to a case in which the vacuum conveyance robot A provided to the second conveyance chamber T2 was configured such that the arm 200 could be operated in a reverse direction while being expanded or contracted without the use of a rotary mechanism. The present invention is not limited to this option alone, however. It is also possible to adopt an arrangement in which the arm is expanded and contracted using a rotary mechanism. FIGS. 15 to 21 illustrate a double-arm scalar robot having such a mechanism.

Figure 15:
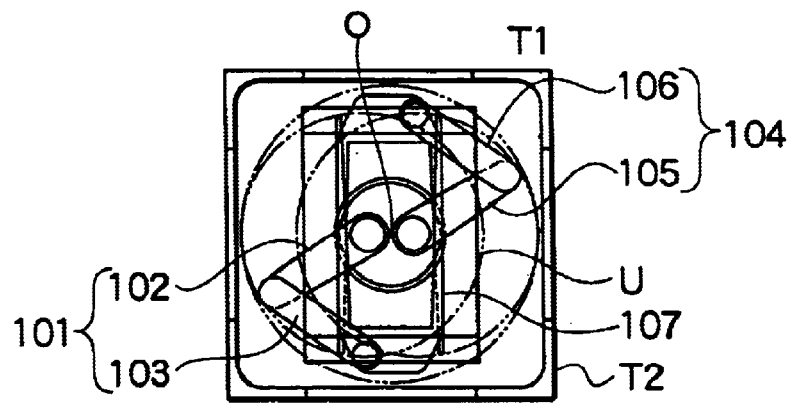
FIG. 15 is a plan view of a contracted double-arm scalar robot according to an embodiment.
Figure 16:
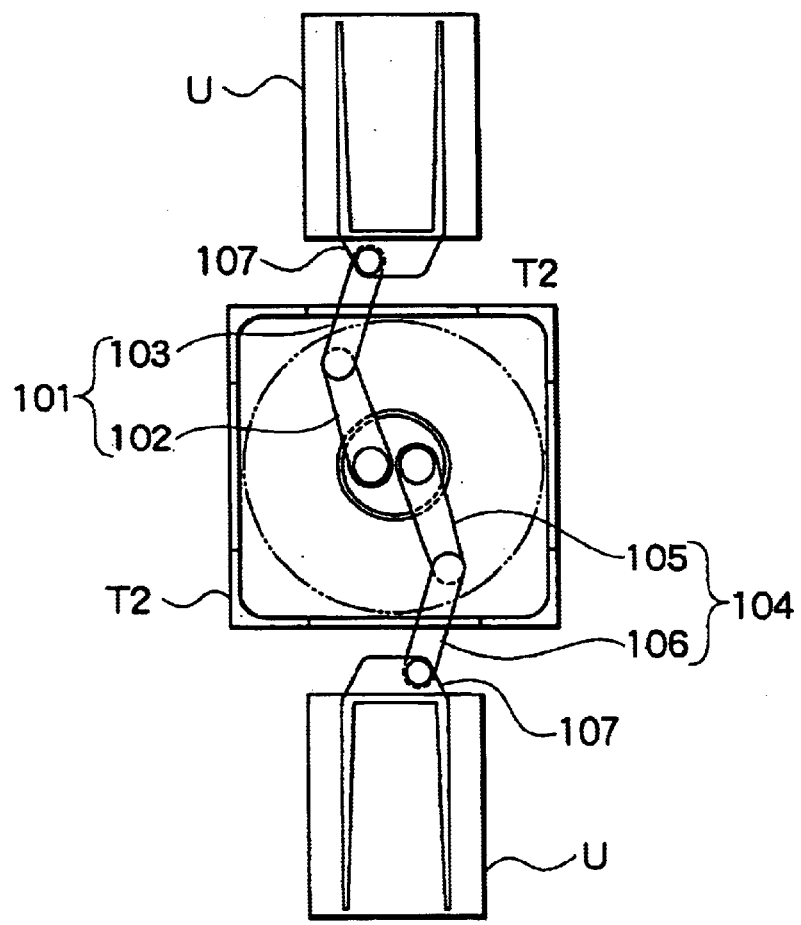
FIG. 16 is a plan view of the expanded double-arm scalar robot according to an embodiment.

FIG. 15 is a plan view of a contracted state of two (double) arms 101 and 104, and FIG. 16 is a plan view of an expanded state of the upper and lower arms 101 and 104. The two arms 101 and 104 can be simultaneously expanded and contracted without mutual interference by adopting an arrangement in which the arms 101 and 104 have point symmetry about the center of rotation O, and are offset in the vertical direction. The upper arm 101 comprises a first arm 102 and a second arm 103. The lower arm 104 comprises a first arm 105 and a second arm 106. The tips of the second arms 103 and 106 are provided with end effectors 107 as substrate support units for mounting substrates U. In a contracted state, the two arms 101 and 104 are folded centrosymmetrically into a dogleg configuration, and are stored inside the second conveyance chamber T2, as shown in FIG. 15. In this state, the two end effectors 107 are superposed one above the other. In an extended state, each arm is stretched substantially rectilinearly and is extended outside the second conveyance chamber T2, with the two end effectors 107 resembling open palms, as shown in FIG. 16. The end effectors 107 can be made to move in a straight lane by rotating the two arms 101 and 104.

Figure 17:
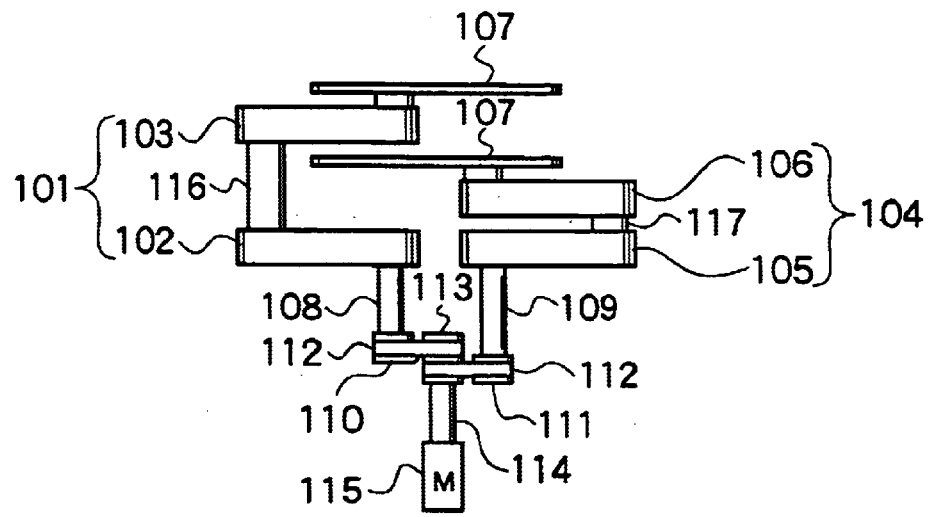
FIG. 17 is a front view of the contracted double-arm scalar robot according to an embodiment.

FIG. 17 depicts a front view of the vacuum conveyance robot with contracted arms. In this drawing, the connecting shaft 116 between the first arm 102 and second arm 103 constituting the upper arm 101 is made longer than the connecting shaft 117 between the first arm 105 and second arm 106 constituting the lower arm 104, and the two arms 101 and 104 are offset in the vertical direction in the manner described above, whereby the lower-tier end effector 107 is stored between the upper-tier first arm 102 and second arm 103 when contracted. The arms are telescopically and concurrently operated in opposite directions using the following mechanism.

Figure 18:
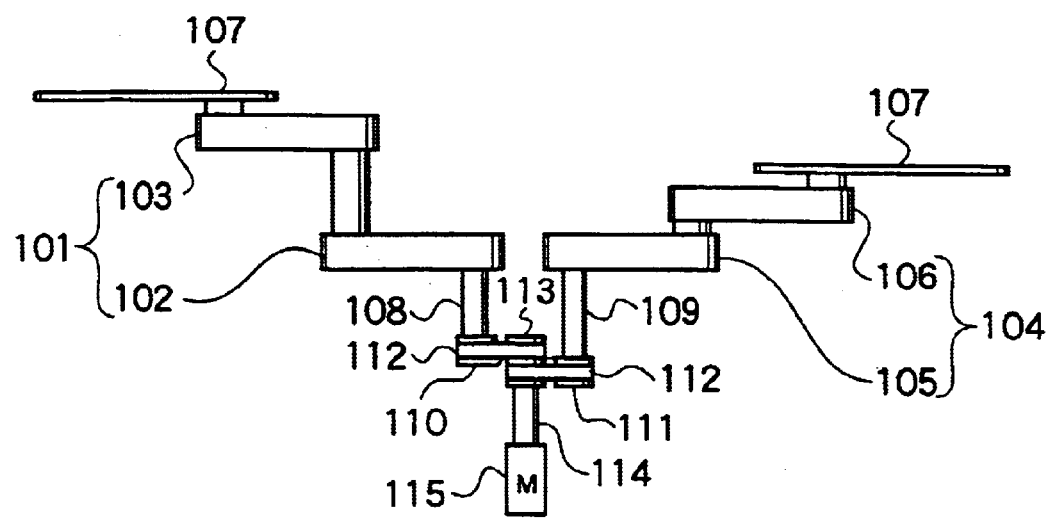
FIG. 18 is a front view of the expanded double-arm scalar robot according to an embodiment.

A drive shaft pulley 113 provided to the drive shaft 114 of a common drive source 115 is rotated by the common drive source 115, and this rotation is transmitted via belts 112 and 112 to driven shaft pulleys 110 and 111, which are mounted on an upper arm drive shaft 108 and a lower arm drive shaft 109, respectively. The upper arm drive shaft 108 and lower arm drive shaft 109 are thus rotated, and the double arms 101 and 104 are turned and moved telescopically and concurrently in opposite directions. FIG. 18 is a front view of the vacuum conveyance robot A with an extended arm.

Figure 19:
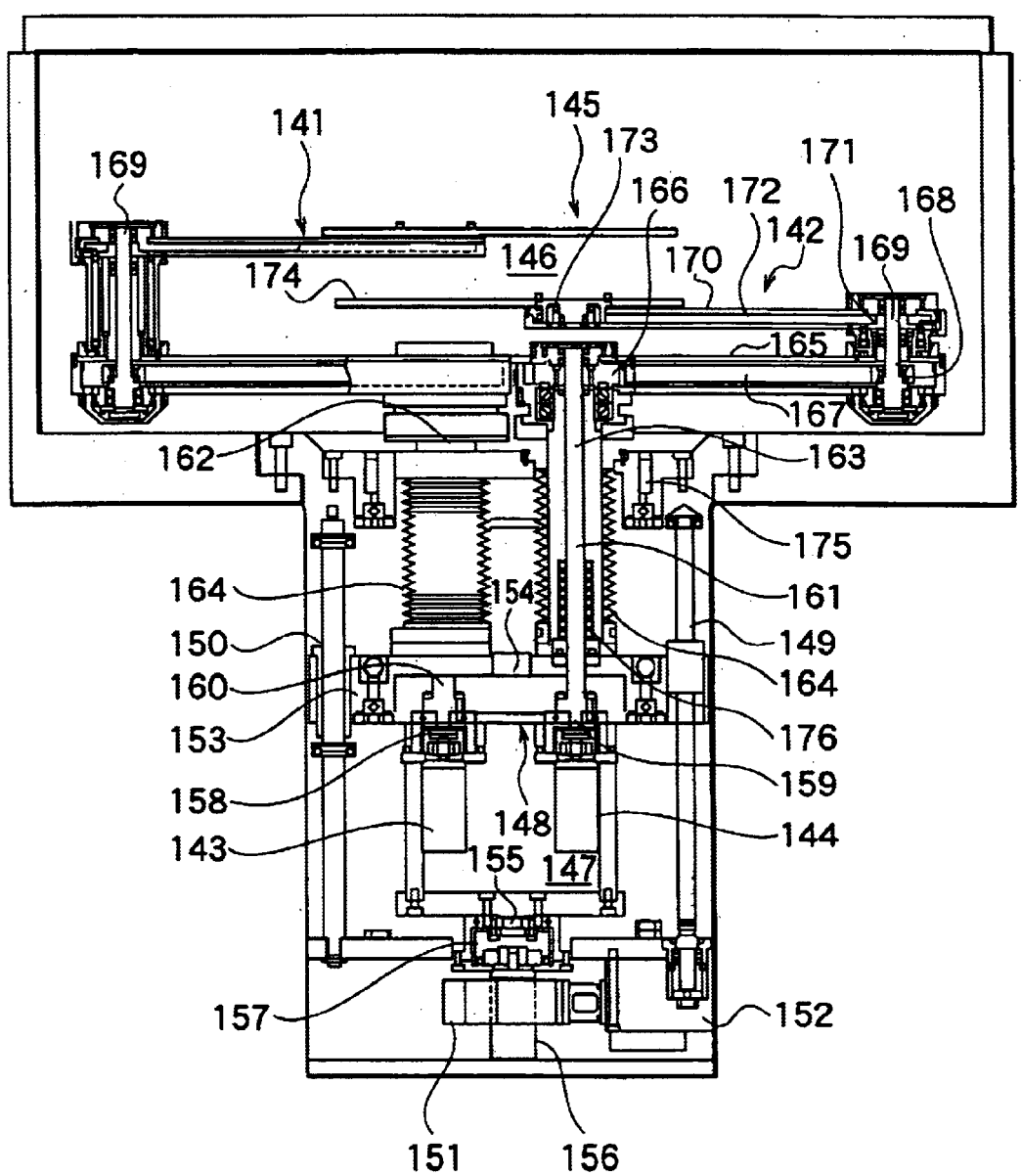
FIG. 19 is a cross section of two drive transmission systems for the double-arm scalar robot according to an embodiment.

The drive transmission system of the above-described double-arm scalar robot will now be described in detail. FIG. 19 depicts a mechanism in which separate drive sources 143 and 144 are used as two arms 141 and 142, respectively. A two-part substrate conveying unit 145 comprising the two arms 141 and 142 as the constituent elements thereof is disposed inside a vacuumed substrate conveying chamber 146 while allowed to move vertically and turn within a horizontal plane as a whole. To allow the substrate conveying unit 145 to move vertically, the substrate conveying unit 145 is mounted on a lifting platform 148 inside the drive chamber 147 in the bottom portion of a substrate conveying unit. The right-hand end of the lifting platform 148 is in threaded engagement with a Z-axis ball screw 149, and the left-hand end thereof is fitted into a Z-axis guide 150. The ball screw 149 is reduced in speed and rotated through the agency of a Z-axis reduction gear 152 by a Z-axis drive source 151 provided to the bottom portion of the drive chamber 147. The resulting rotation moves the lifting platform 148 in the vertical direction and raises or lowers the entire substrate conveying unit 145. To allow the substrate conveying unit 145 to turn within the horizontal plane, the lifting platform 148 is provided such that a lifting platform central unit 154 can rotate about a θ-axis 155 in relation to a lifting platform circumferential unit 153 that accommodates the θ-axis ball screw 149 and the Z-axis guide 150. The lifting platform central unit 154 is reduced in speed and rotated through the agency of θ-axis reduction gear 157 by a θ-axis drive source 156 aligned with the θ-axis, turning the substrate conveying unit 145 in the process.

An upper arm drive source 143 and a lower arm drive source 144 for independently turning the upper arm 141 and lower arm 142, respectively, are provided separately to the bottom surface of the lifting platform central unit 154. The rotation of the upper arm drive source 143 and lower arm drive source 144 is reduced in speed by an upper arm reduction gear 158 and a lower arm reduction gear 159, and is transmitted to an R-axis upper arm drive shaft 160 and an R-axis lower a&r drive shaft 161, respectively, turning the upper arm 141 and lower arm 142, which are linked to the R-axis upper arm drive shaft 160 and R-axis lower arm drive shaft 161. The drive shafts 160 and 161 pass through bearing housings 162 and 163. The bearing housings 162 and 163 are enclosed in a bellows 164 to maintain airtightness in the substrate conveying chamber 146 during the axial movement of the bearing housings 162 and 163.

The operation of the substrate conveying unit 145 will now be described. Because the upper arm 141 and lower arm 142 of the substrate conveying unit 145 operate in the same manner, the description will be limited to the lower arm 142. The rotation of the R-axis lower arm drive shaft 161 is transmitted to a first arm 165. The first arm 165 transmits this rotation from a fixed pulley 166, first to a transmission pulley 168 via a belt 167 and then to a second arm 170 via a connecting shaft 169. The second arm 170 receives the rotation by means of a floating pulley 171, transmits this rotation via a belt 172 to a driven pulley 173, and finally transmits this rotation to an end effector 174. In FIG. 19, 175 is a θ-axis magnetic fluid seal, and 176 is an R-axis magnetic fluid seal.

Figure 20:
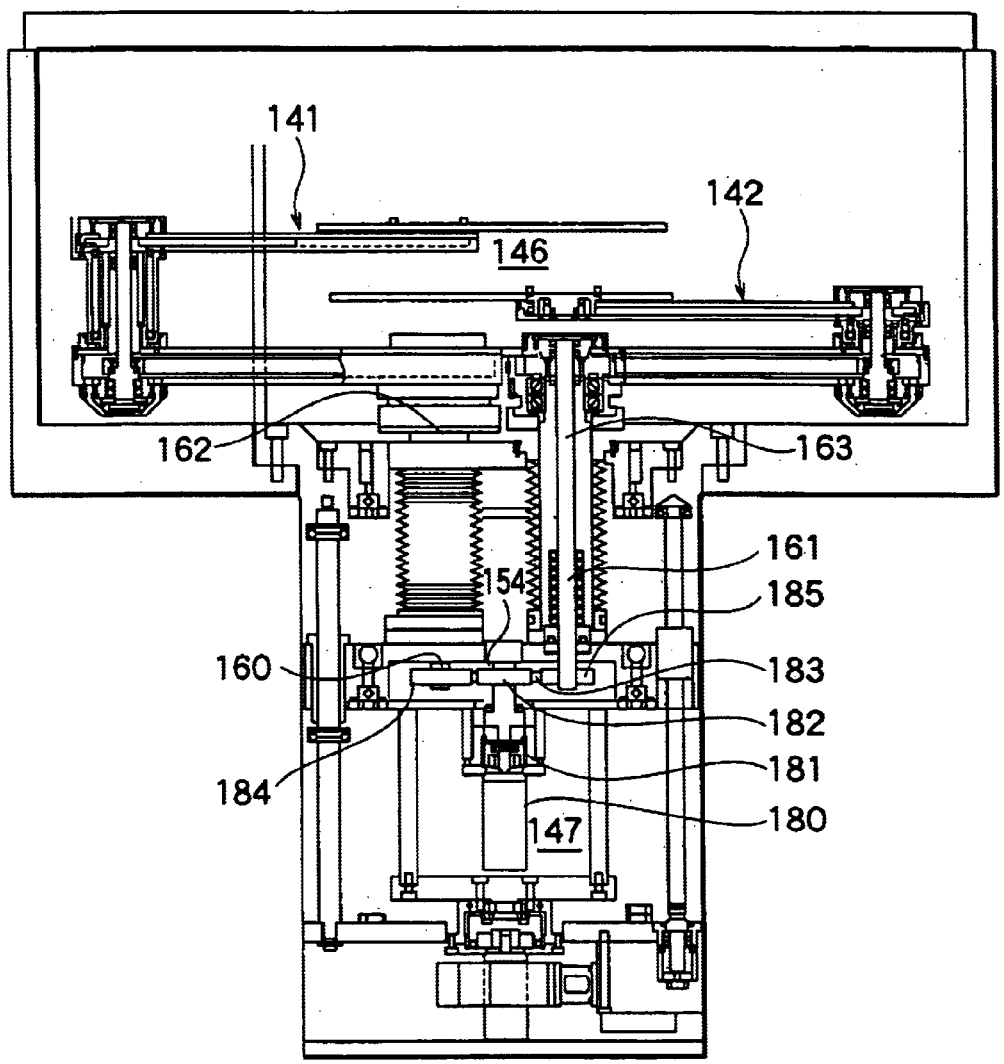
FIG. 20 is a cross section of a single drive transmission system for the double-arm scalar robot according to an embodiment.

The mechanism described with reference to FIG. 19 concerned a case in which two arms were independently driven by two drive sources 143 and 144. FIG. 20 depicts a mechanism in which a drive effort is transmitted to two arms by a single common drive source 180. The mechanism in FIG. 20 is substantially the same as the mechanism in FIG. 19, the difference being that a single R-axis drive source 180 is used, and its, rotation is transmitted to an R-axis upper arm drive shaft 160 and an R-axis lower arm drive shaft 161 by a belt 183 and pulleys 182, 184 and 185, respectively. Specifically, the rotation of the single R-axis drive source 180, which is provided to the center of the bottom portion of the lifting platform central unit 154, is reduced in speed by an R-axis reduction gear 181, and the effort from the R-axis main driving pulley 182 19 divided between and transmitted to the R-axis upper arm driven pulley 184 and an R-axis lower arm driven pulley 185 by means of the R-axis transmission belt 183, causing the R-axis upper arm drive shaft 160 and R-axis lower arm drive shaft 161 to rotate. As a result, the structure is simplified and the costs are reduced in comparison with the mechanism in FIG. 19.

Figure 21:
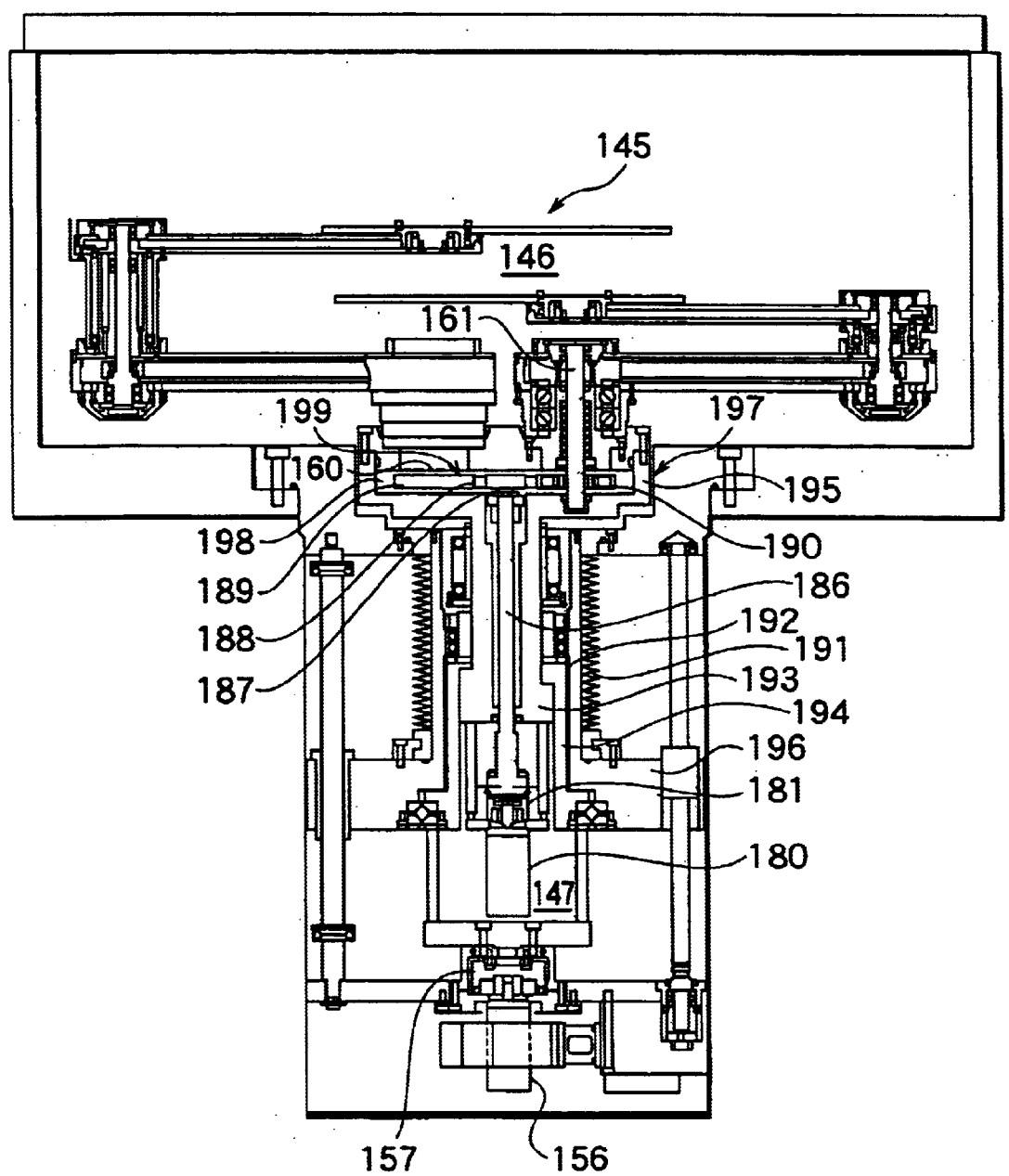
FIG. 21 is a cross section of a single drive transmission system for the double-arm scalar robot according to an embodiment.

The mechanism in FIG. 21 is obtained by simplifying the mechanism in FIG. 20 even further. In FIG. 20, the unit for dividing and transmitting the rotation of, the R-axis drive source 180 is provided to the external portion of the substrate conveying chamber 146, that is, to the lifting platform central unit 154 inside the drive chamber 147. By contrast, FIG. 21 shows an arrangement in which a divided transmission unit 199 is provided inside the substrate conveying chamber 146. This yields a nested structure in which the centers of hollow θ-shafts (lifting platform central axial unit 193 and θ-axis drive shaft 194) and an R-axis drive shaft 186 are coaxial with a hollow Z-shaft (lifting platform circumferential hollow shaft unit) 192.

A detailed description will now be given. The body 195 of a lifting platform central unit 197 is brought out of a lifting platform circumferential unit 196 and placed into the substrate conveying chamber 146. The lifting platform central axial unit 193, which is a θ-shaft extending below the lifting platform central unit body 195, is configured such that the central portion of the lifting platform circumferential unit 196 is extended upward and rotatably inserted into the lifting platform circumferential hollow shaft unit 192, which is a Z-shaft. As a result, the lifting platform central unit 197 moves vertically together with the vertical movement of the lifting platform circumferential unit 196 and is rotatably supported in relation to the lifting platform circumferential unit 196. In addition, the lifting platform central axial unit 193 is linked to the hollow the θ-axis drive shaft 194 (which transmits the rotation of the θ-axis drive source 156 via the θ-axis reduction gear 157) inside the lifting platform circumferential hollow shaft unit 192, making it possible to turn the substrate conveying unit 145.

The interior of the lifting platform central unit body 195 in the substrate conveying chamber 146 is provided with a chamber 198, and the above-described divided transmission unit 199 is disposed inside this chamber 198. Rotation of the R-axis drive source 180 is transmitted to the divided transmission unit 199 in the following manner. Rotation of a single R-axis drive source 180 is reduced in speed by the R-axis reduction gear 181 and transmitted directly to the interior of the lifting platform central unit body 195 by the upwardly projecting R-axis drive shaft 186. The rotation is transmitted from an R-axis main drive pulley 187 via an R-axis transmission belt 188 and distributed between an R-axis upper arm driven pulley 189 linked to the R-axis upper arm drive shaft 160, and an R-axis lower arm driven pulley 190 linked to the R-axis lower arm drive shaft 161 in the lifting platform central unit body 195. Because the transmitted drive force is divided after a vacuum has been established, a single bellows 191 can be used to ensure airtightness during the axial movement of the lifting platform circumferential hollow shaft unit 192, the structure can be simplified, and the costs can be reduced.

In the above-described substrate conveying device, the rotation of the drive shaft 114 of the common drive source 115 is transmitted by the belt 112 directly to the upper arm drive shaft 108 and lower arm drive shaft 109, as shown in FIG. 17, when, however, one of the arms 101 and 104 in this structure becomes inoperative as a result of a malfunction or the like, the other arm (104 or 101) becomes inoperative as well because the drive shafts 108 and 109 of these arms 101 and 104 are connected by the belt 112. A resulting drawback is that the breakdown of a single arm disables the entire substrate processing device. In the embodiment that follows, this drawback is overcome by providing clutch mechanisms and brake mechanisms to the upper arm drive shaft 108 and lower arm drive shaft 109, respectively.

Figure 22:
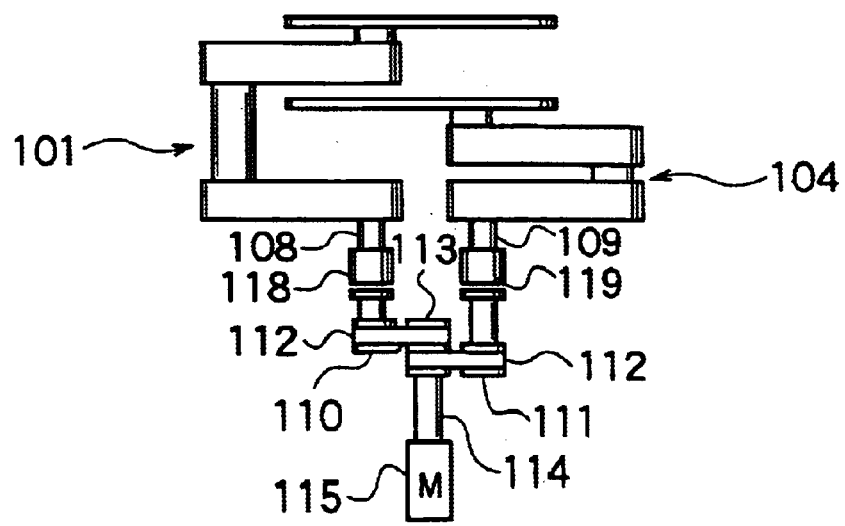
FIG. 22 is a schematic illustrating the drive transmission system provided with a clutch mechanism according to an embodiment.

The vacuum conveyance chamber of the LCD plasma CVD device shown in FIG. 22 is provided with a vacuum conveyance robot whose two arms can operate in mutually opposite directions at the same time. In this robot, the upper arm drive shaft 108 and lower arm drive shaft 109 for operating the upper arm 101 and, lower arm 104 are equipped with clutch mechanisms 118 and 119, respectively.

Figure 23:
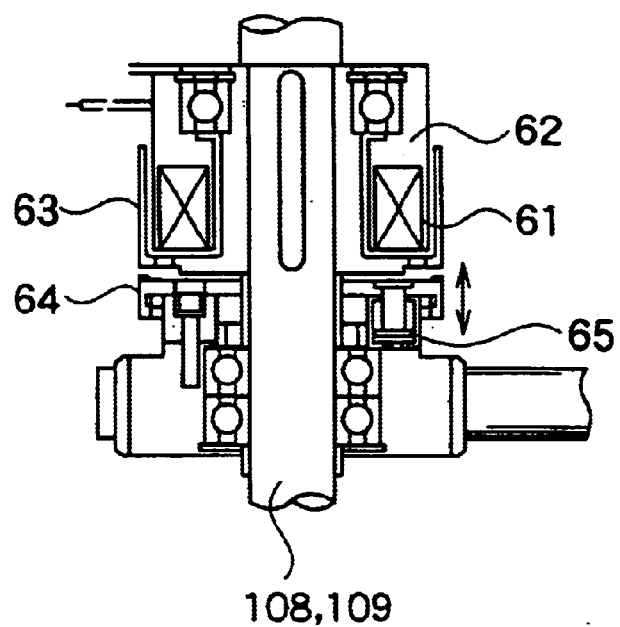
FIG. 23 is a detailed diagram of the clutch mechanism in FIG. 22.

The clutch mechanisms 118 and 119 may be commonly known devices. A conceptual diagram thereof is presented in FIG. 23, Passing an electric current through a coil 61 creates a magnetic flux between a field coil 62, a rotor 63, and an armature 64; the armature 64 is attracted by the rotor 63; and the teeth of the two components interlock, engaging the clutch. Discontinuing the current causes a spring 65 to cut off the armature 64, disengaging the clutch. When the upper arm 101 alone is to be operated using this clutch arrangement, power from the drive source 115 can be transmitted solely to the upper arm drive shaft 108 without being transmitted to the lower arm drive shaft 109 by cutting off the lower arm clutch mechanism 119. The upper arm 101 alone can thus be operated. When the objective is to operate the lower arm 104 alone, power can be transmitted to the lower arm drive shaft 109 alone by adopting a reverse procedure, namely, by cutting off the upper arm clutch mechanism 118. The lower arm 104 alone can thus be operated. A single arm can be operated by switching between these two modes.

Figure 24:
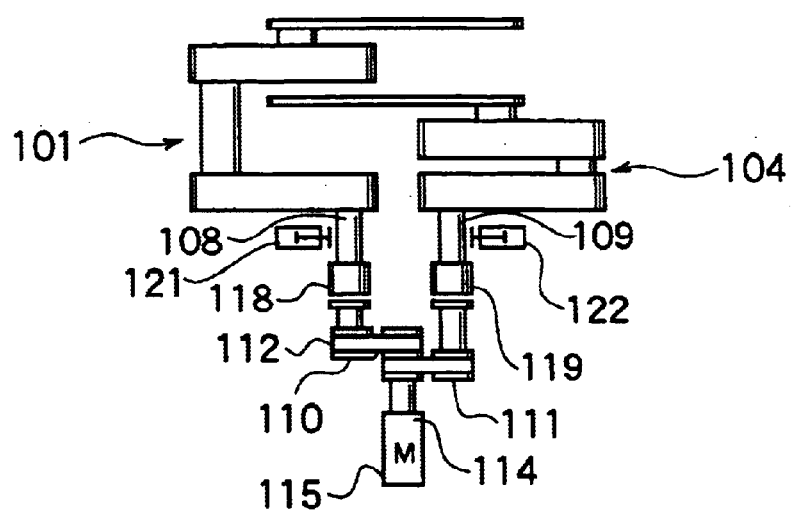
FIG. 24 is a schematic illustrating a drive transmission system obtained by providing the clutch mechanism with a brake mechanism according to an embodiment.
Figure 25:
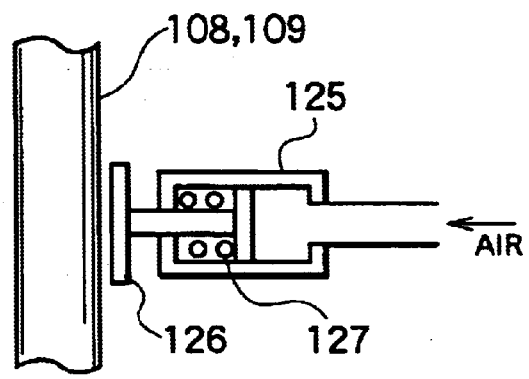
FIG. 25 is a front view of the example of a brake mechanism in FIG. 24.
Figure 26:
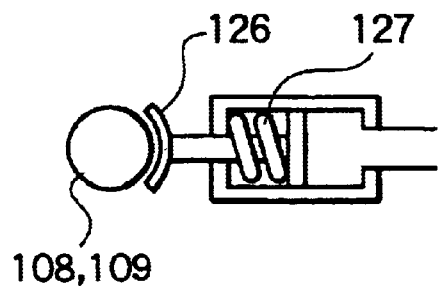
FIG. 26 is a plan view of the example of a brake mechanism in FIG. 24.
Figure 27:
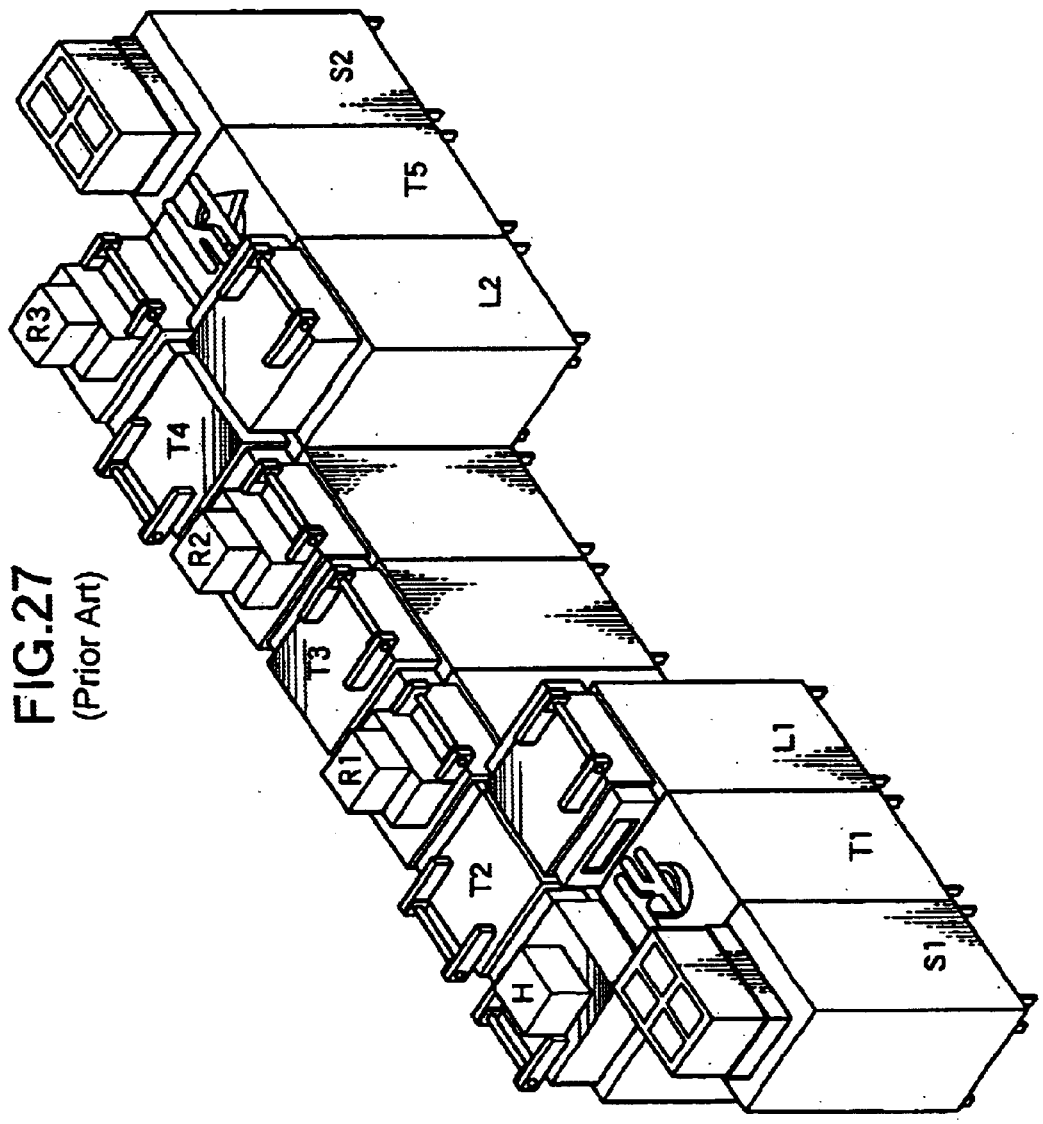
FIG. 27 is a structural example of a conventional in-line LCD plasma CVD device.
Figure 28:
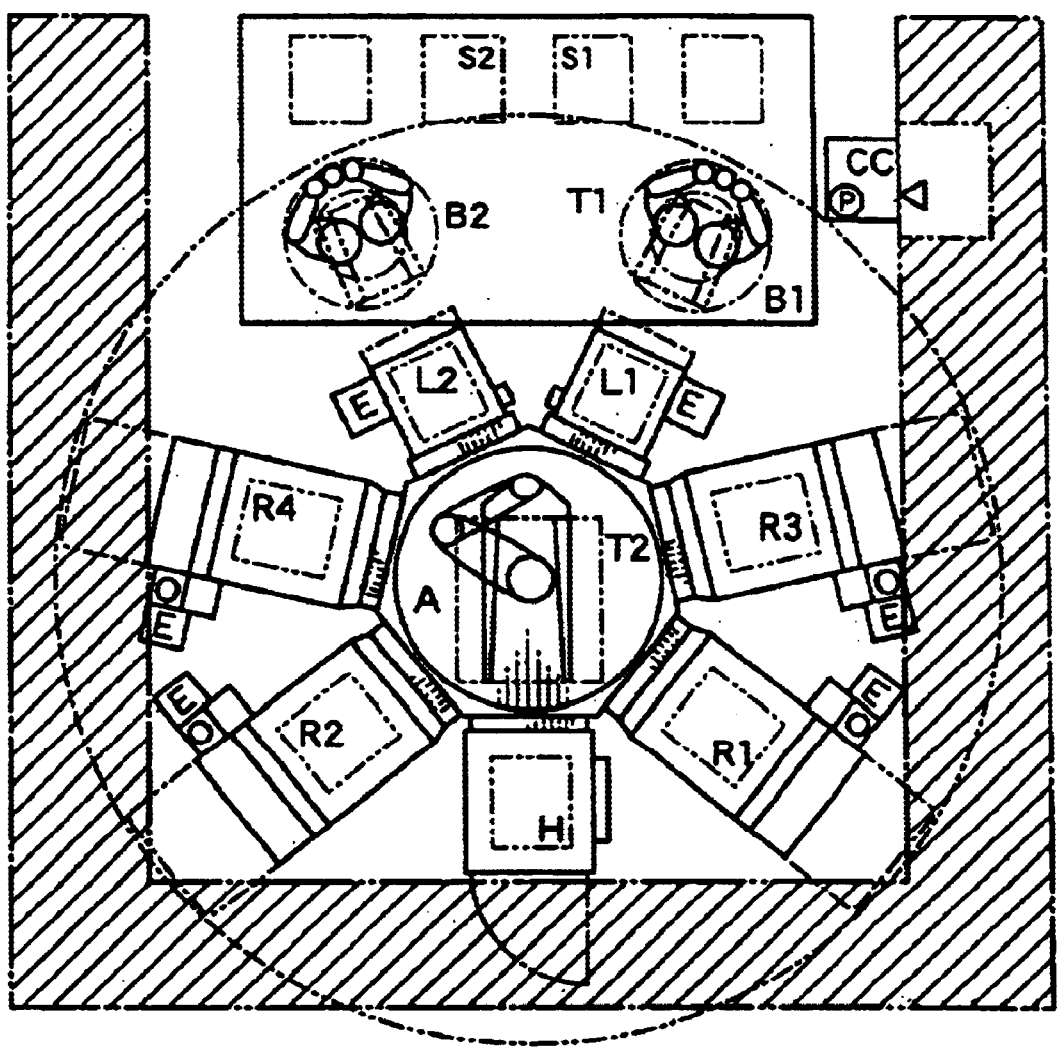
FIG. 28 is a structural example of a conventional LCD plasma CVD device.

The embodiment in FIG. 24 is a modification of the embodiment in FIG. 22, where the arm drive shafts 108 and 109 are provided with clutch mechanisms 118 and 119. In the modified conveyance mechanism, the upper arm drive shaft 108 and lower arm drive shaft 109 are further provided with brake mechanisms 121 and 122. Conceptual diagrams of the brake mechanisms 121 and 122 are shown in FIGS. 25 and 26. In the brake mechanisms 121 and 122, a brake shoe 126 is provided, for example, to the tip of a single-piston air cylinder 125, the brake shoe 126 is caused to overcome the force of a spring 127 and to press against the upper arm drive shaft 108 or lower arm drive shaft 109 when air is admitted, and the operation of the drive shaft is stopped by the force of friction between the brake shoe 126 and the drive shafts 108 and 109. The result is that if the upper arm clutch mechanism 118 is cut off during the turning of the vacuum conveyance robot A, the drive shaft 108 can still be stopped by the upper arm brake mechanism 121, making it possible to prevent the upper arm 101 from being actuated by centrifugal force. If the lower arm clutch mechanism 119 is cut off during the turning of the vacuum conveyance robot A, the lower arm 104 can still be stopped by the lower arm brake mechanism 122. Switching the clutch mechanisms and brake mechanisms allows processed substrates to be removed and the device to be repaired with minimal labor without stopping the entire device during an arm malfunction.

As seen from the embodiments described above, the system of the present invention is not a cluster-type system having a multiaxial configuration but a monoline-type system having a uniaxial configuration. The question here is whether adopting a monoline-type system is good policy when a plurality of film-forming chambers and other vacuum chambers are to be installed. When, for example, there is a need for a plurality of film-forming chambers in which a multi-layer film is formed in each chamber, adopting a cluster-type system instead of enlarging the monoline-type system is sometimes beneficial because of lower cost or reduced floor space.

The number of film-forming chambers determines the system type better suited to lowering the costs and reducing the floor space. The cluster type becomes more beneficial as the number of film-forming chambers increases. The monoline type is commonly more advantageous for a smaller number of chambers. Let us assume, for example, that a cluster can contain no more than six film-forming chambers. In this case, the monoline type is more beneficial for one to three chambers, and the cluster type is more beneficial for four to six chambers. But if cost and footprint of chamber except processing chamber, such as substrate preparation chamber, vacuum conveyance chamber etc., can be by means mentioned untill now, point of branch between the cluster-type and monoline-type shifts toward direction which the number of film-forming chambers increases. Thereby, there is a case in which monoline-type to more beneficial independent of the number of film-forming chambers. Based in this premise, the merits of monoline-type systems will now be considered from the standpoint of adjusting the production volume.

In the LCD industry, lines are built by making incremental investments in response to market trends. Maximum efficiency is achieved when sets containing the smallest possible number of repeating units are used to achieve the desired capacity (throughput) of a production line. The production volume is usually low in such cases. To achieve such efficiency, the number of units in each set must be reduced and the needed production volume obtained by reducing the throughput of each unit (it is apparent that cost and footprint considerations must also be taken into account). Panel manufacturers tend to make incremental investments (in which each individual investment is limited to a small amount) because future LCD market trends change very rapidly.

Monoline-type systems are believed to be suitable for such incremental investments. When, for example, three film-forming chambers are needed to build a line producing 5000 components a month, the relative cost and footprint for equipment other than the film-forming chambers are greater in the case of a cluster system, which is thus less efficient to use. In principle, a cluster of six film-forming chambers is sufficient for increasing the monthly production to 10,000 components, in which case a cluster of three film-forming chambers may be added to the existing three-chamber cluster, or additional chambers may be installed along the unoccupied sides of the existing cluster, The first approach entails extra costs and requires providing additional footprint because of the need to install two systems, each of which performs conveyance, load locking, preheating, and other added functions. With the second approach, the entire production is temporarily stopped. By contrast, a monoline-type system can be realized at a low cost and with a small footprint as a result of the fact that conveyance, load looking, preheating, and other added functions are streamlined or the like, making it possible to provide the optimum number of film-forming chambers needed to achieve the required throughput without having any adverse effect in terms of cost or footprint. These advantages become more pronounced at lower production levels (or smaller production increases), and are regarded as providing more benefits for single films than for three-layer films. Single films (SiN, $n^+$, and SiO for protective film applications) generally have shorter film-forming periods and a higher throughput per film-forming chamber. In the above-described example of 5000 components per month, using one or two film-forming chambers is sufficient, and a monoline-type system is more effective to use.

According tothe present invention, the substrate processing device has a uniaxial configuration, the substrate conveyance time can be reduced to produce a shorter substrate processing cycle, and the number of substrates processed per unit of time can be increased.

What is claimed is:

1. A substrate processing device, comprising:
    a substrate processing chamber for subjecting a substrate to prescribed processing;
    a substrate storage chamber for storing an unprocessed substrate scheduled to undergo the prescribed processing in said substrate processing chamber, and a processed substrate that has undergone the prescribed processing therein; and
    a substrate conveying device disposed between said substrate processing chamber and said substrate storage chamber and for conveying the unprocessed substrate from said substrate storage chamber to said substrate processing chamber, and conveying the processed substrate from said substrate processing chamber to said substrate storage chamber;
    wherein said substrate conveying device comprises:
        a first substrate conveying unit conveying the substrate between said substrate storage chamber and said substrate processing chamber;
        a second substrate conveying unit conveying the substrate between said substrate storage chamber and said substrate processing chamber; and
        an operating unit to operate said first and second substrate conveying units in such a manner that the substrates conveyed with said first and second substrate conveying units are put in vertical two tiers so as to be laid on top of one another above a drive shaft of said first and second substrate conveying units, so that said first and second substrate conveying units are operated in opposite directions along the arrangement direction of said substrate processing chamber, said substrate storage chamber and said substrate conveying device, and so that said first and second substrate conveying units are operated in such a manner that the processed substrate is conveyed from said substrate processing chamber to said substrate storage chamber with either one substrate conveying unit out of said first and second substrate conveying units, while the unprocessed substrate is conveyed from said substrate storage chamber to said substrate processing chamber with the other substrate conveying unit.

2. A substrate processing device as claimed in claim 1, wherein
    said substrate storage chamber includes:
        a first substrate storage unit for storing the unprocessed substrate scheduled to undergo prescribed processing therein; and
        a second substrate storage unit for storing the processed substrate that have undergone the prescribed processing therein.

3. A substrate processing device as defined in claim 2, wherein
said substrate processing chamber includes a first substrate mounting unit provided with a first substrate mounting surface for mounting the substrate thereon;
said first substrate storage unit of said substrate storage chamber includes a second substrate mounting unit provided with a second substrate mounting surface for mounting the substrate thereon;
said first substrate conveying unit includes a third substrate mounting unit provided with a third mounting surface for mounting the substrate thereon;
said second substrate conveying unit includes a fourth substrate mounting unit provided with a fourth substrate mounting surface for mounting the substrate thereon;
a separation is established between the first substrate mounting surface and the second mounting surface;
a separation is established between the third substrate mounting surface and the fourth substrate mounting surface; and
the separation between the first and second substrate mounting surfaces is made substantially the same as the separation between the third and fourth substrate mounting surfaces.

4. A substrate processing device as defined in claim 2, wherein
said substrate processing chamber includes a first substrate mounting unit provided with a first substrate mounting surface for mounting the substrate thereon;
said second substrate storage unit of said substrate storage chamber includes a second substrate mounting unit provided with a second substrate mounting surface for mounting the substrate thereon;
said first substrate conveying unit includes a third substrate mounting unit provided with a third mounting surface for mounting the substrate thereon;
said second substrate conveying unit includes a fourth substrate mounting unit provided with a fourth substrate mounting surface for mounting the substrate thereon;
a separation is established between the first substrate mounting surface and the second mounting surface;
a separation is established between the third substrate mounting surface and the fourth substrate mounting surface; and
the separation between the first and second substrate mounting surfaces is made substantially the same as the separation between the third and fourth substrate mounting surfaces.

5. A substrate processing device as defined in claim 2, wherein said first substrate storage unit and said second storage unit in said substrate storage chamber are set to be different in height from each other; wherein said substrate processing chamber includes a substrate mounting unit onto which the substrate is mounted; and wherein the height of the substrate mounting unit is set between the height of said first substrate storage unit and the height of said second substrate storage unit in said substrate storage chamber.

6. A substrate processing device as defined in claim 1, wherein
said substrate storage chamber is structured to include 3 or more substrate storage units;
the substrate processing device further comprises a position changing unit which enables to change the position of said substrate storage chamber;
said substrate storage units are for storing the unprocessed substrate or the processed substrate respectively;
said position changing unit changes the position of said substrate storage chamber to a position to access a substrate storage unit storing the unprocessed substrate with one substrate conveying unit out of the first and second substrate conveying units when the unprocessed substrate scheduled to undergo prescribed processing is withdrawn from the substrate storage chamber with the one substrate conveying unit, or to a position to access a substrate storage unit to which the processed substrate that has undergone prescribed processing is delivered with the other substrate conveying unit when the processed substrate is delivered into the substrate storage chamber with the other substrate conveying unit.

7. A substrate processing device as defined in claim 1, wherein
said substrate processing chamber, said substrate storage chamber, and said substrate conveying device are arranged linearly seen from above so that said substrate conveying device is positioned in the middle.

8. A substrate processing device as defined in claim 7, wherein only one each of said substrate processing chamber, said substrate storage chamber and said substrate conveying device is provided.

9. A substrate processing device as defined in claim 1, wherein
said substrate storage chamber includes:
a substrate storage unit for storing the unprocessed substrate scheduled to undergo the prescribed processing;
a heater for heating the substrate stored in the substrate storage unit;
a gas introducing unit for introducing gas to heat the substrate;
a gas heating unit for heating the gas introduced by the gas introducing unit with the heater; and
a gas supplying unit for supplying the gas heated with the gas heating unit to the substrate stored in said substrate storage unit like a shower.

10. A substrate processing device as defined in claim 1, wherein:
said operating unit is structured to operate said first and second substrate conveying units so that conveying operation of the unprocessed substrate from said substrate storage chamber to said substrate processing chamber with the one substrate conveying unit, and conveying operation of the processed substrate from said substrate processing chamber to said substrate storage chamber with the other substrate conveying unit are started simultaneously.

11. A substrate processing device, as defined in claim 1, wherein:
said operating unit is structured to interlockingly operate said first and second substrate conveying units in opposite directions along the arrangement direction of said substrate processing chamber, said substrate storage chamber, and said substrate conveying device.

12. A substrate processing device as defined in claim 11, wherein only one each of said substrate processing chamber, said substrate storage chamber and said substrate conveying device is provided.

13. A substrate processing device as defined in claim 1, wherein;
said substrate storage chamber includes a substrate storage unit;

a cassette which can stack plural substrates and hold them is disposed at substantially the same height as said substrate storage chamber at atmospheric pressure outside said substrate storage chamber; and a substrate conveying device for allowing the substrate to be delivered is provided between said cassette and said substrate storage chamber, wherein said substrate storage unit of said substrate storage chamber is positioned so that it may position in the stack range of said plural substrates stacked and held in the cassette.

14. A substrate processing device as defined in claim 1, wherein:

an operation in which the processed substrate is conveyed from said substrate processing chamber to said substrate storage chamber with the one substrate conveying unit, while the unprocessed substrate is conveyed from said substrate storage chamber to said substrate processing chamber with the other substrate conveying unit is an operation in which the processed substrate is conveyed from said substrate processing chamber to said substrate storage chamber with the one substrate conveying unit, and at the same time, the unprocessed substrate is conveyed from said substrate storage chamber to said substrate processing chamber with the other substrate conveying unit.

15. A substrate processing device according to claim 1, wherein said operating unit is structured to operate said first and second substrate conveying units in such a manner that the processed substrate is conveyed from said substrate processing chamber to said substrate storage chamber while the unprocessed substrate is conveyed from said substrate storage chamber to said substrate processing chamber, only by expansion and contraction of said first and second substrate conveying units.

16. A substrate conveying device for conveying a substrate between a first substrate mounting position for mounting the substrate thereon and a second substrate mounting position for mounting another substrate thereon, said substrate conveying device comprising:

a first substrate conveying unit conveying the substrate between said first substrate mounting position and said second substrate mounting position;

a second substrate conveying unit conveying aforementioned another substrate between said first substrate mounting position and said second substrate mounting position; and an operating unit to operate said first and second substrate conveying units in such a manner that the substrates conveyed with said first and second substrate conveying units are put in vertical two tiers so as to be laid on top of one another above a drive shaft of said first and second substrate conveying units, so that said first and second substrate conveying units are operated in opposite directions along the arrangement direction of said first substrate mounting position, said second substrate mounting position and said substrate conveying device, and so that said first and second substrate conveying units are operated in such a manner that the substrate is conveyed from said first substrate mounting position to said second substrate mounting position with either one substrate conveying unit out of said first and second substrate conveying units, while aforementioned another substrate is conveyed from said second substrate mounting position to said second substrate mounting position with the other substrate conveying unit.

17. A substrate processing device, comprising:

a substrate conveying device disposed between a first substrate mounting position for mounting the substrate thereon and a second substrate mounting position for mounting another substrate thereon, and for conveying the substrates between said first substrate mounting position and said second substrate mounting position; and a substrate processing chamber for subjecting the substrate conveyed with the substrate conveying device to prescribed processing, wherein said substrate conveying device, comprises:

a first substrate conveying unit conveying the substrate between said first substrate mounting position and said second substrate mounting position;

a second substrate conveying unit conveying aforementioned another substrate between said first substrate mounting position and said second substrate mounting position; and an operating unit to operate said first and second substrate conveying units in such a manner that the substrates conveyed with said first and second substrate conveying units are put in vertical two tiers so as to be laid on top of one another above a drive shaft of said first and second substrate conveying units, so that said first and second substrate conveying units are operated in opposite directions along the arrangement direction of said first substrate mounting position, said second substrate mounting position and said substrate conveying device, and so that said first and second substrate conveying units are operated in such a manner that the substrate is conveyed from said first substrate mounting position to said second substrate mounting position with either one substrate conveying unit out of said first and second substrate conveying units, while the aforementioned another substrate is conveyed from said second substrate mounting position to said second substrate mounting position with the other substrate conveying unit.

18. A substrate processing device as defined in claim 17, wherein said operating unit is structured to operate said first and second substrate conveying units so that conveying operation of the substrate from said first substrate mounting position to said second substrate mounting position with the one substrate conveying unit and conveying operation of the aforementioned another substrate from said second substrate mounting position to said second substrate mounting position with the other substrate conveying unit are started simultaneously.

* * * * *